US012573581B2

(12) United States Patent
Osterberg et al.

(10) Patent No.: US 12,573,581 B2
(45) Date of Patent: Mar. 10, 2026

(54) ELECTRON OPTICAL COLUMN AND METHOD FOR DIRECTING A BEAM OF PRIMARY ELECTRONS ONTO A SAMPLE

(71) Applicant: ASML Netherlands B.V., Veldhoven (NL)

(72) Inventors: Mans Johan Bertil Osterberg, Rijswijk (NL); Kenichi Kanai, Palo Alto, CA (US)

(73) Assignee: ASML Netherlands B.V., Veldhoven (NL)

( * ) Notice: Subject to any disclaimer, the term of this patent is extended or adjusted under 35 U.S.C. 154(b) by 442 days.

(21) Appl. No.: 18/269,269

(22) PCT Filed: Nov. 29, 2021

(86) PCT No.: PCT/EP2021/083352
§ 371 (c)(1),
(2) Date: Jun. 22, 2023

(87) PCT Pub. No.: WO2022/135842
PCT Pub. Date: Jun. 30, 2022

(65) Prior Publication Data
US 2024/0055219 A1     Feb. 15, 2024

Related U.S. Application Data

(60) Provisional application No. 63/177,563, filed on Apr. 21, 2021, provisional application No. 63/129,330, filed on Dec. 22, 2020.

(30) Foreign Application Priority Data

May 4, 2021     (EP) ..................................... 21171996

(51) Int. Cl.
*H01J 37/147*     (2006.01)
*H01J 37/05*     (2006.01)
(Continued)

(52) U.S. Cl.
CPC .......... *H01J 37/1472* (2013.01); *H01J 37/05* (2013.01); *H01J 37/153* (2013.01); *H01J 37/24* (2013.01);
(Continued)

(58) Field of Classification Search
CPC ........ H01J 37/00; H01J 37/1472; H01J 37/05; H01J 37/153; H01J 37/24; H01J 37/26;
(Continued)

(56) References Cited

U.S. PATENT DOCUMENTS 7,755,045 B2     7/2010   Hatano et al.
8,373,136 B2     2/2013   Schoenecker et al.
(Continued)

FOREIGN PATENT DOCUMENTS

CN     103779160 A     5/2014
CN     110945621 A     3/2020
(Continued)

OTHER PUBLICATIONS

International Search Report issued in related Foreign Application No. PCT/EP2021/083352; mailed Feb. 24, 2022 (2 pgs.).
(Continued)

*Primary Examiner* — Jason L Mccormack
(74) *Attorney, Agent, or Firm* — FINNEGAN, HENDERSON, FARABOW, GARRETT & DUNNER, LLP

(57)     ABSTRACT

Apparatus and methods for directing a beam of primary electrons along a primary beam path onto a sample are disclosed. In one arrangement, a beam separator diverts away from the primary beam path a beam of secondary electrons emitted from the sample along the primary beam path. A dispersion device is upbeam from the beam separator. The dispersion device compensates for dispersion induced in the primary beam by the beam separator. One or (Continued)

more common power supplies drive both the beam separator and the dispersion device.

20 Claims, 15 Drawing Sheets

(51) Int. Cl.
| | |
|---|---|
| *H01J 37/153* | (2006.01) |
| *H01J 37/24* | (2006.01) |
| *H01J 37/28* | (2006.01) |

(52) U.S. Cl.
CPC ....... *H01J 37/28* (2013.01); *H01J 2237/1508* (2013.01)

(58) Field of Classification Search
CPC .. H01J 37/28; H01J 37/147; H01J 2237/1508; H01J 2237/1534
USPC .............................. 250/306, 307, 311, 492.3
See application file for complete search history.

(56) References Cited

U.S. PATENT DOCUMENTS

| | | | |
|---|---|---|---|
| 8,766,181 B2 | 7/2014 | Zewail et al. | |
| 9,035,249 B1 * | 5/2015 | Frosien ................. | H01J 37/244 |
| | | | 250/311 |
| 9,153,413 B2 | 10/2015 | Almogy et al. | |
| 9,443,699 B2 | 9/2016 | Platzgummer et al. | |
| 10,090,131 B2 | 10/2018 | Jiang et al. | |
| 2011/0089322 A1 | 4/2011 | Schoenecker et al. | |
| 2013/0248731 A1 * | 9/2013 | Tanimoto .............. | H01J 37/153 |
| | | | 250/396 R |

| | | | | |
|---|---|---|---|---|
| 2016/0329186 A1 | 11/2016 | Li et al. | | |
| 2016/0329189 A1 | 11/2016 | Sears et al. | | |
| 2019/0035595 A1 * | 1/2019 | Ren ........................ | | H01J 37/14 |
| 2019/0259564 A1 | 8/2019 | Kruit et al. | | |

FOREIGN PATENT DOCUMENTS

| | | | | |
|---|---|---|---|---|
| EP | 2879155 B1 | | 4/2018 | |
| JP | H02-60042 A | | 2/1990 | |
| JP | H06-119906 A | | 4/1994 | |
| JP | 2007087639 A | | 4/2007 | |
| JP | 2007141488 A | * | 6/2007 | |
| JP | 2011238612 A | | 11/2011 | |
| JP | 2020528197 A | | 9/2020 | |
| TW | 201941244 A | | 10/2019 | |
| TW | 201946086 A | | 12/2019 | |

OTHER PUBLICATIONS

W. D. Meisburger et al., "Low-voltage electron-optical system for the high-speed inspection of integrated circuits," Journal of Vacuum Science & Technology B: Microelectronics and Nanometer Structures Processing, Measurement, and Phenomena 10, 2804 (1992); doi: 10.1116/1.586006.

M. Kienle et al., "An off-axis multi-channel analyzer for secondary electrons," Nuclear Instruments and Methods in Physics Research A 519 (2004) 325-330.

S. Beck et al., "Low-voltage probe forming cols. for electrons," Nuclear Instruments and Methods in Physics Research. A 363 (1995) 31-42.

W H J Andersen et al, "A double weinfilter as a high resolution, high transmission electron energy analyser," Journal of Physics E: Scientific Instruments, 1970, vol. 3, pp. 121-126.

* cited by examiner

<u>100</u>

104B

ELECTRON OPTICAL COLUMN AND METHOD FOR DIRECTING A BEAM OF PRIMARY ELECTRONS ONTO A SAMPLE

CROSS-REFERENCE TO RELATED APPLICATIONS

This application claims priority to International Application No. PCT/EP2021/083352, filed Nov. 29, 2021, and published as WO 2022/135842 A1, which claims priority of U.S. application 63/129,330 which was filed on 22 Dec. 2020 and U.S. application 63/177,563 which was filed on 21 Apr. 2021 and EP application 21171996.8 which was filed on May 4, 2021. The contents of these applications are incorporated herein by reference in their entireties.

TECHNICAL FIELD

The present disclosure generally relates to the field of charged particle beam apparatus, and more particularly to an electron optical column and methods in which dispersion of a beam separator in a single-beam or multi-beam apparatus is compensated.

BACKGROUND

In manufacturing processes of integrated circuits (ICs), unfinished or finished circuit components are inspected to ensure that they are manufactured according to design and are free of defects. An inspection system utilizing an optical microscope typically has resolution down to a few hundred nanometers; and the resolution is limited by the wavelength of light. As the physical sizes of IC components continue to reduce down to a sub-100 or even sub-10 nanometers, inspection systems capable of higher resolution than those utilizing optical microscopes are needed.

A charged particle (e.g., electron) beam microscope, such as a scanning electron microscope (SEM) or a transmission electron microscope (TEM), capable of resolution down to less than a nanometer, serves as a practicable tool for inspecting IC components having a feature size that is sub-100 nanometers. With an SEM, electrons of a single primary electron beam, or electrons of a plurality of primary electron beams, can be focused at probe spots of a wafer under inspection. The interactions of the primary electrons with the wafer can result in one or more secondary electron beams. The secondary electron beams may comprise backscattered electrons, secondary electrons, or Auger electrons, resulting from the interactions of the primary electrons with the wafer. The intensity of the one or more secondary electron beams can vary based on the properties of the internal and/or external structures of the wafer.

The intensity of the secondary electron beams can be determined using a detection device or detector. The secondary electron beams can form one or more beam spots at pre-determined locations on a surface of the detector. The detector can generate electrical signals (e.g., a current, a voltage, etc.) that represent an intensity of the detected secondary electron beams. The electrical signals can be measured with measurement circuitries (e.g., analog-to-digital converters) to obtain a distribution of the detected electrons. The electron distribution data collected during a detection time window, in combination with corresponding scan path data of the one or more primary electron beams incident on the wafer surface, can be used to reconstruct images of the wafer structures under inspection. The reconstructed images can be used to reveal various features of the internal and/or external structures of the wafer, and can be used to reveal any defects that may exist in the wafer.

In an inspection system comprising a single primary beam and a single secondary beam (single-beam apparatus), the detector can be placed along an optical axis of the apparatus if it has a hole allowing the primary beam to pass through. However, the presence of the hole can reduce detection efficiency of the secondary beam and in some cases result in a black spot on the center of the reconstructed images. A beam separator can be used to separate the secondary beam from the primary beam and direct the secondary beam towards a detector placed off-axis. In an inspection system comprising multiple primary beams and multiple secondary beams (multi-beam apparatus), a beam separator can be used to separate the multiple secondary beams from the multiple primary beams and direct the multiple secondary beams towards a detector placed off-axis.

The beam separator comprises at least one magnetic deflector and therefore generates dispersion on the one or more primary beams and the one or more secondary beams. The dispersion can deform the round probe spot of a primary beam into an oblong shape. The dispersion can also deform the detected beam spots thereby causing deterioration in resolution of the reconstructed image.

SUMMARY

According to an aspect, there is provided an electron optical column configured to direct a beam of primary electrons along a primary beam path onto a sample, comprising: a beam separator configured to divert away from the primary beam path a beam of secondary electrons emitted from the sample along the primary beam path; a dispersion device upbeam from the beam separator, the dispersion device being configured to compensate for dispersion induced in the primary beam by the beam separator; and one or more common power supplies each configured to drive both the beam separator and the dispersion device.

According to an aspect, there is provided a method of directing a beam of primary electrons along a primary beam path onto a sample, comprising: using a beam separator to divert away from the primary beam path a beam of secondary electrons emitted from the sample along the primary beam path; and using a dispersion device upbeam from the beam separator to compensate for dispersion induced in the primary beam by the beam separator, wherein one or more common power supplies are used to drive both the beam separator and the dispersion device.

Additional objects and advantages of the disclosed embodiments will be set forth in part in the following description, and in part will be apparent from the description, or may be learned by practice of the embodiments. The objects and advantages of the disclosed embodiments may be realized and attained by the elements and combinations set forth in the claims.

It is to be understood that both the foregoing general description and the following detailed description are exemplary and explanatory only and are not restrictive of the disclosed embodiments, as claimed.

DESCRIPTION OF THE EMBODIMENTS

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The present disclosure relates to systems and methods for compensating dispersion of a beam separator in a single-beam or multi-beam apparatus. A beam separator generates dispersion on the one or more primary beams and the one or more secondary beams. Embodiments of the present disclosure provide a dispersion device comprising an electrostatic deflector and a magnetic deflector configured to induce a beam dispersion set to cancel the dispersion generated by the beam separator. The combination of the electrostatic deflector and the magnetic deflector can be used to keep a deflection angle (due to the dispersion device) unchanged when the induced beam dispersion is changed to compensate for a change in the dispersion generated by the beam separator. In some embodiments, the deflection angle can be controlled to be zero and there is no change in primary beam axis due to the dispersion device. In some embodiments, the dispersion device can comprise a multi-pole lens (e.g., quadrupole lens) configured to generate a quadrupole field to cancel at least one of the impacts of astigmatism aberrations caused by the beam separator and the dispersion device on the probe spot formed by the primary beam.

Figure 1:
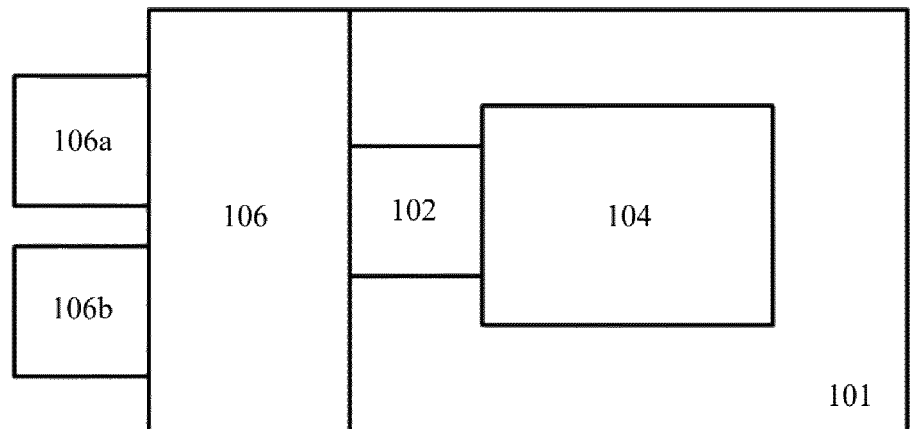
FIG. 1 is a schematic diagram illustrating an exemplary electron beam inspection (EBI) system, consistent with embodiments of the present disclosure.

Reference is now made to FIG. 1, which illustrates an exemplary electron beam inspection (EBI) system 100 consistent with embodiments of the present disclosure. As shown in FIG. 1, EBI system 100 includes a main chamber 101, a load/lock chamber 102, an electron beam tool 104, and an equipment front end module (EFEM) 106. Electron beam tool 104 is located within main chamber 101.

EFEM 106 includes a first loading port 106a and a second loading port 106b. EFEM 106 may include additional loading port(s). First loading port 106a and second loading port 106b can receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 106 can transport the wafers to load/lock chamber 102.

Load/lock chamber 102 is connected to a load/lock vacuum pump system (not shown), which removes gas molecules in load/lock chamber 102 to reach a first pressure below the atmospheric pressure. After reaching the first pressure, one or more robot arms (not shown) can transport the wafer from load/lock chamber 102 to main chamber 101. Main chamber 101 is connected to a main chamber vacuum pump system (not shown), which removes gas molecules in main chamber 101 to reach a second pressure below the first pressure. After reaching the second pressure, the wafer is subject to inspection by electron beam tool 104.

Figure 2A:
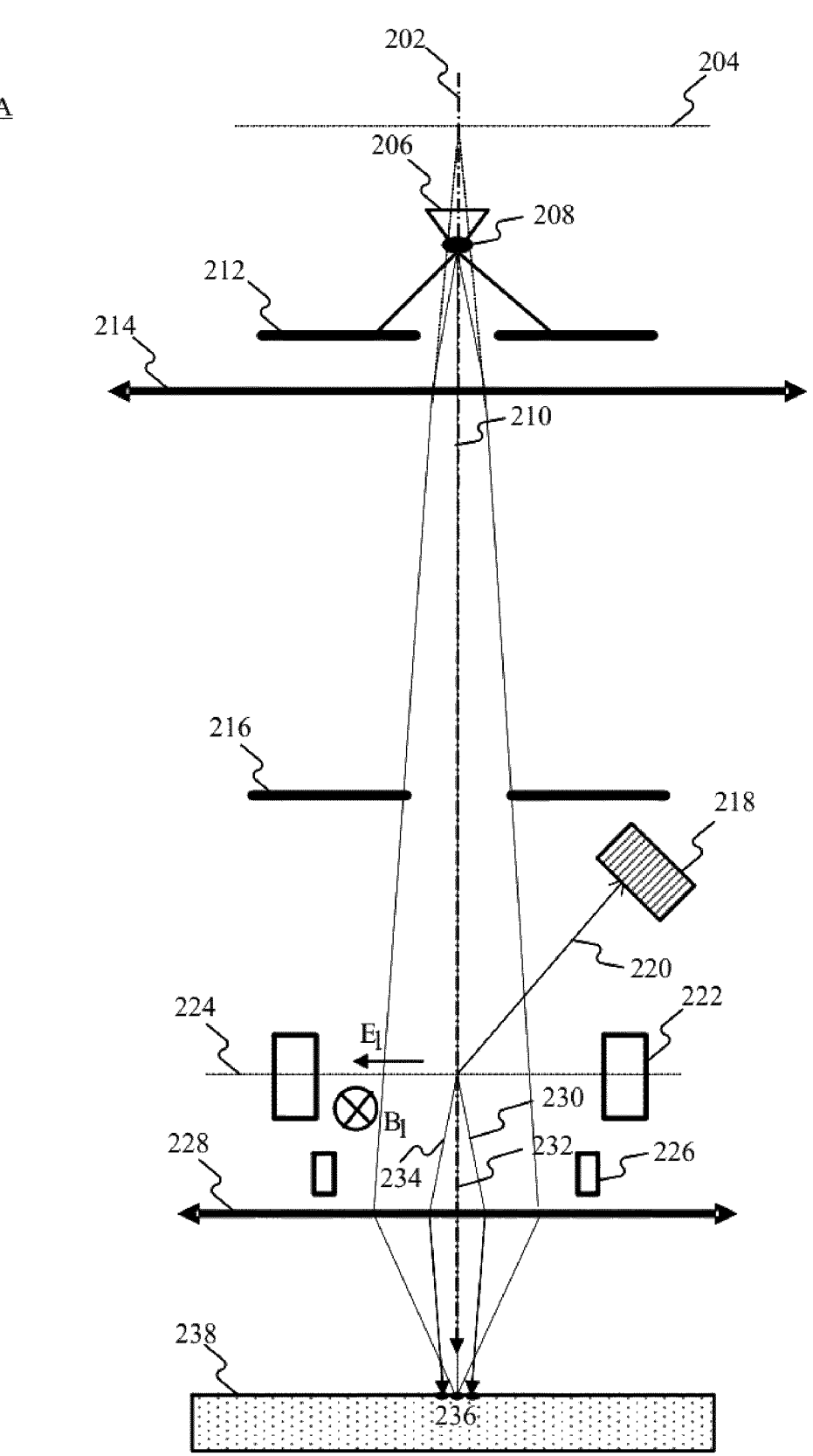
FIG. 2A, 2B are schematic diagrams illustrating an exemplary electron beam tool that can be a part of the exemplary electron beam inspection system of FIG. 1, consistent with embodiments of the present disclosure.

Reference is now made to FIG. 2A, which illustrates exemplary components of electron beam tool 104 consistent with embodiments of the present disclosure. FIG. 2A illustrates an electron beam tool 104A (also referred to herein as apparatus 104A) comprising an electron source 206, a gun aperture 212, a condenser lens 214, a primary electron beam 210 emitted from electron source 206, a beam-limit aperture 216, a beam separator 222, a deflection scanning unit 226, an objective lens 228, a sample stage (not shown in FIG. 2A), a secondary electron beam 220, and an electron detector 218. Electron source 206, gun aperture 212, condenser lens 214, beam-limit aperture 216, beam separator 222, deflection scanning unit 226, and objective lens 228 can be aligned with optical axis 202 of apparatus 104A.

Electron source 206 can comprise a cathode, an extractor or an anode, wherein primary electrons can be emitted from the cathode and extracted or accelerated to form a primary electron beam 210 with high energy (e.g., 8-20 keV), high angular intensity (e.g., 0.1-1 mA/sr) and a crossover (virtual or real) 208. Primary electron beam 210 can be visualized as being emitted from crossover 208. Gun aperture 212 can block off peripheral electrons of primary electron beam 210 to reduce Coulomb effect. The Coulomb effect can cause an increase in size of a probe spot 236.

Condenser lens 214 can focus primary electron beam 210 and beam-limit aperture 216 can limit the size of primary electron beam 210. The electric current of primary electron beam 210 downstream of beam-limit aperture 216 can be varied by adjusting the focusing power of condenser lens 214 or by changing the radial size of beam-limit aperture 216. Objective lens 228 can focus primary electron beam 210 onto a sample 238 for inspection. Primary electron beam 210 can form probe spot 236 on surface of sample 238.

In response to incidence of primary electron beam 210 at probe spot 236, secondary electron beam 220 can be emitted from sample 238. Secondary electron beam 220 can comprise electrons with a distribution of energies including secondary electrons (energies $\leq$50 eV) and backscattered electrons (energies between 50 eV and landing energies of primary electron beam 210).

Beam separator 222 can be a beam separator of Wien filter type comprising an electrostatic deflector generating an electrostatic dipole field E1 and a magnetic dipole field B1. For a beam separator of Wien filter type, the force exerted by electrostatic dipole field E1 on an electron of primary electron beam 210 is equal in magnitude and opposite in direction to the force exerted on the electron by magnetic dipole field B1. Primary electron beam 210 can therefore pass straight through beam separator 222 with zero deflection angle. However, the total dispersion of primary electron beam 210 generated by beam separator 222 is non-zero. For a dispersion plane 224 of beam separator 222, FIG. 2A shows dispersion of primary electron beam 210 with nominal energy $V_0$ and an energy spread $\Delta V$ into beam portion 230 corresponding to energy $V_0-\Delta V/2$, beam portion 232 corresponding to energy $V_0$, and beam portion 234 corresponding to energy $V_0+\Delta V/2$. The total force exerted by beam separator 222 on an electron of secondary electron beam 220 is non-zero. Beam separator 222 can therefore separate secondary electron beam 220 from primary electron beam 210 and direct secondary electron beam 220 towards electron detector 218. Electron detector 218 can detect secondary electron beam 220 and generate a corresponding signal.

Deflection scanning unit 226 can deflect primary electron beam 210 to scan probe spot 236 over a surface area of sample 238. Electron detector 218 can detect corresponding secondary electron beam 220 and generate corresponding signals used to reconstruct an image of surface area of sample 238.

An object plane 204 of objective lens 228 can shift with changes in focusing power of condenser lens 214. For primary electron beam 210, if dispersion plane 224 of beam separator 222 and object plane 204 of objective lens 228 do not coincide, beam portions 230, 232, and 234 stay separated and probe spot 236 is extended in the dispersion direction. This can cause deterioration in resolution of reconstructed image of sample 238.

Figure 2B:
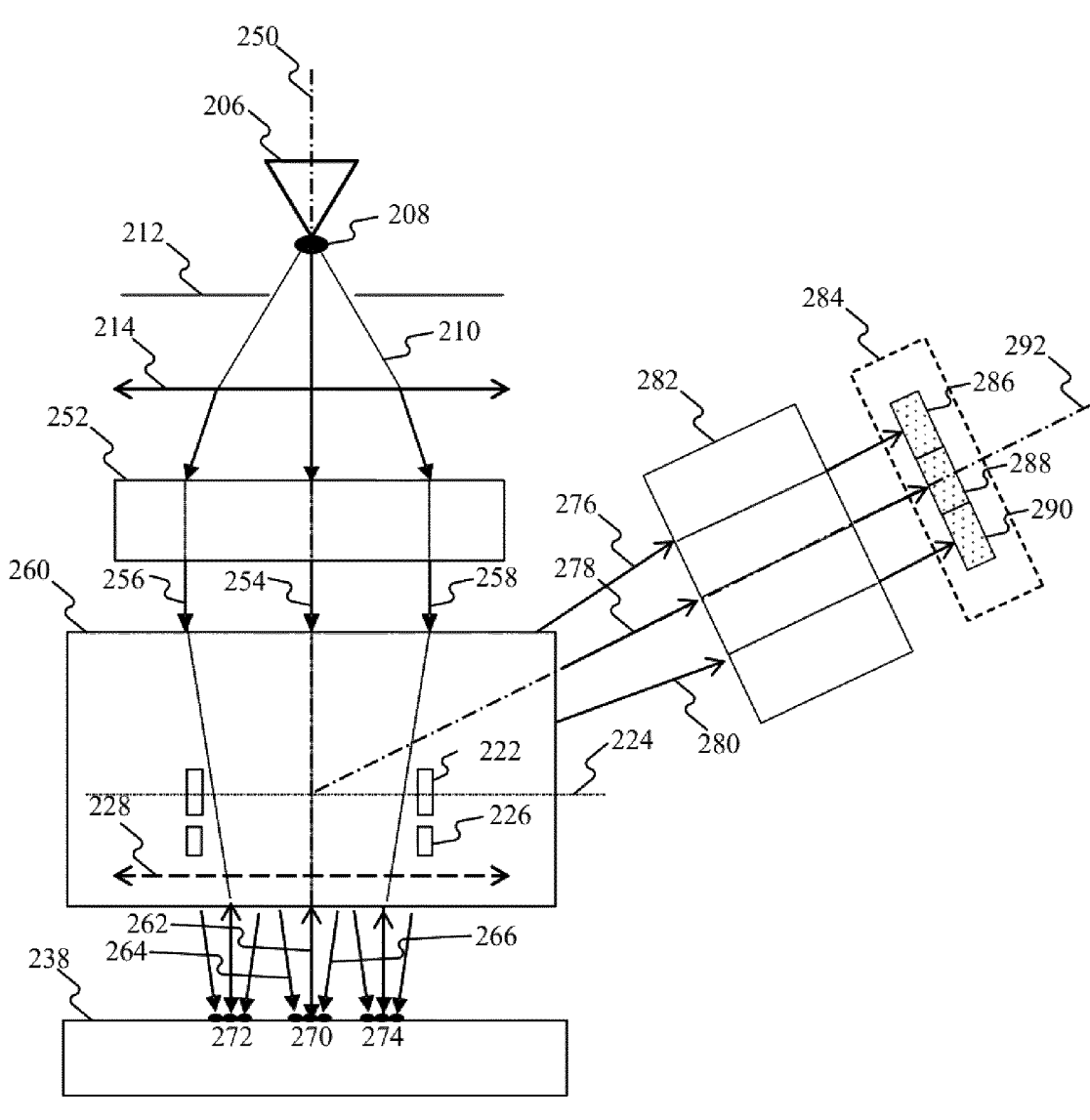

Reference is now made to FIG. 2B, which illustrates an electron beam tool 104B (also referred to herein as apparatus 104B) comprising an electron source 206, a gun aperture 212, a condenser lens 214, a primary electron beam 210 emitted from electron source 206, a source conversion unit 252, a plurality of beamlets 254, 256, and 258 of primary electron beam 210, a primary projection optical system 260, a sample stage (not shown in FIG. 2B), multiple secondary electron beams 276, 278, and 280, a secondary optical system 282, and an electron detection device 284. Primary projection optical system 260 can comprise an objective lens 228. Electron detection device 284 can comprise detection elements 286, 288, and 290. Beam separator 222 and deflection scanning unit 226 can be placed inside primary projection optical system 260.

Electron source 206, gun aperture 212, condenser lens 214, source conversion unit 252, beam separator 222, deflection scanning unit 226, and objective lens 228 can be aligned with a primary optical axis 250 of apparatus 104B.

Secondary optical system 282 and electron detection device 284 can be aligned with a secondary optical axis 292 of apparatus 104B.

Electron source 206 can comprise a cathode, an extractor or an anode, wherein primary electrons can be emitted from the cathode and extracted or accelerated to form a primary electron beam 210 with a crossover (virtual or real) 208. Primary electron beam 210 can be visualized as being emitted from crossover 208. Gun aperture 212 can block off peripheral electrons of primary electron beam 210 to reduce Coulomb effect. The gun aperture 212 may be referred to as a Coulomb aperture; the plate in which the aperture is defined may be referred to as a Coulomb aperture plate. The Coulomb effect can cause an increase in size of probe spots 270, 272, and 274.

Source conversion unit 252 can comprise an array of image-forming elements (not shown in FIG. 2B) and an array of beam-limit apertures (not shown in FIG. 2B). The array of image-forming elements can comprise an array of micro-deflectors or micro-lenses. The array of image-forming elements can form a plurality of parallel images (virtual or real) of crossover 208 with a plurality of beamlets 254, 256, and 258 of primary electron beam 210. The array of beam-limit apertures can limit the plurality of beamlets 254, 256, and 258.

Condenser lens 214 can focus primary electron beam 210. The electric currents of beamlets 254, 256, and 258 downstream of source conversion unit 252 can be varied by adjusting the focusing power of condenser lens 214 or by changing the radial sizes of the corresponding beam-limit apertures within the array of beam-limit apertures. Objective lens 228 can focus beamlets 254, 256, and 258 onto a sample 238 for inspection and can form a plurality of probe spots 270, 272, and 274 on surface of sample 238.

Beam separator 222 can be a beam separator of Wien filter type comprising an electrostatic deflector generating an electrostatic dipole field E1 and a magnetic dipole field B1 (both of which are not shown in FIG. 2B). If they are applied, the force exerted by electrostatic dipole field E1 on an electron of beamlets 254, 256, and 258 is equal in magnitude and opposite in direction to the force exerted on the electron by magnetic dipole field B1. Beamlets 254, 256, and 258 can therefore pass straight through beam separator 222 with zero deflection angle. However, the total dispersion of beamlets 254, 256, and 258 generated by beam separator 222 is non-zero. For a dispersion plane 224 of beam separator 222, FIG. 2B shows dispersion of beamlet 254 with nominal energy $V_0$ and an energy spread $\Delta V$ into beamlet portions 262 corresponding to energy $V_0$, beamlet portion 264 corresponding to energy $V_0+\Delta V/2$, and beamlet portion 266 corresponding to energy $V_0-\Delta V/2$. The total force exerted by beam separator 222 on an electron of secondary electron beams 276, 278, and 280 is non-zero. Beam separator 222 can therefore separate secondary electron beams 276, 278, and 280 from beamlets 252, 254, and 256 and direct secondary electron beams 276, 278, and 280 towards secondary optical system 282.

Deflection scanning unit 226 can deflect beamlets 254, 256, and 258 to scan probe spots 270, 272, and 274 over a surface area of sample 238. In response to incidence of beamlets 254, 256, and 258 at probe spots 270, 272, and 274, secondary electron beams 276, 278, and 280 can be emitted from sample 238. Secondary electron beams 276, 278, and 280 can comprise electrons with a distribution of energies including secondary electrons (energies $\leq$50 eV) and backscattered electrons (energies between 50 eV and landing energies of beamlets 254, 256, and 258). Secondary optical system 282 can focus secondary electron beams 276, 278, and 280 onto detection elements 286, 288, and 290 of electron detection device 284. Detection elements 286, 288, and 290 can detect corresponding secondary electron beams 276, 278, and 280 and generate corresponding signals used to reconstruct an image of surface area of sample 238.

Figure 3A:
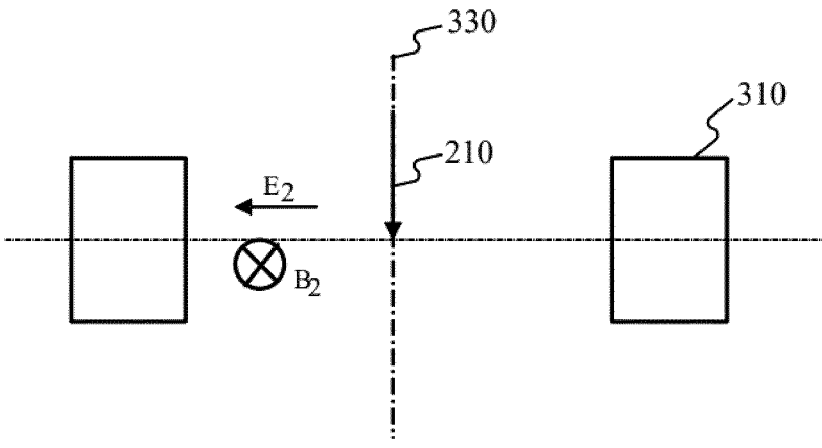
FIG. 3A, 3B, 3C are schematic diagrams illustrating exemplary dispersion devices, consistent with embodiments of the present disclosure.

Reference is now made to FIG. 3A, which is a schematic diagram illustrating exemplary dispersion devices, consistent with embodiments of the present disclosure. FIG. 3A illustrates a dispersion device 310 comprising an electrostatic deflector and a magnetic deflector. The electrostatic deflector can generate an electrostatic dipole field $E_2$ and the magnetic deflector can generate a magnetic dipole field $B_2$, wherein $E_2$ and $B_2$ are superposed substantially perpendicular to each other and to an optical axis 330. The electrostatic dipole field $E_2$ exerts a force $F_e$ and the magnetic dipole field $B_2$ exerts a force $F_m$ on an electron of an electron beam 210 propagating along optical axis 330. The forces $F_e$ and $F_m$ act in substantially opposite directions. The total force exerted by the electrostatic dipole field $E_2$ and the magnetic dipole field $B_2$ on an electron with nominal energy $V_0$ and nominal velocity $v_0$ can be calculated using the following equation:

$$F(v_0)=F_e+F_m=e(E_2-v_0\times B_2) \tag{1}$$

For an electron with energy V0+dV and velocity v0+dv, the total force exerted by the electrostatic dipole field E2 and the magnetic dipole field B2 can be calculated using the following equation:

$$F(v_0+dv)=F_e+F_m=F(v_0)-(e\times dv\times B_2) \tag{2}$$

Figure 3B:
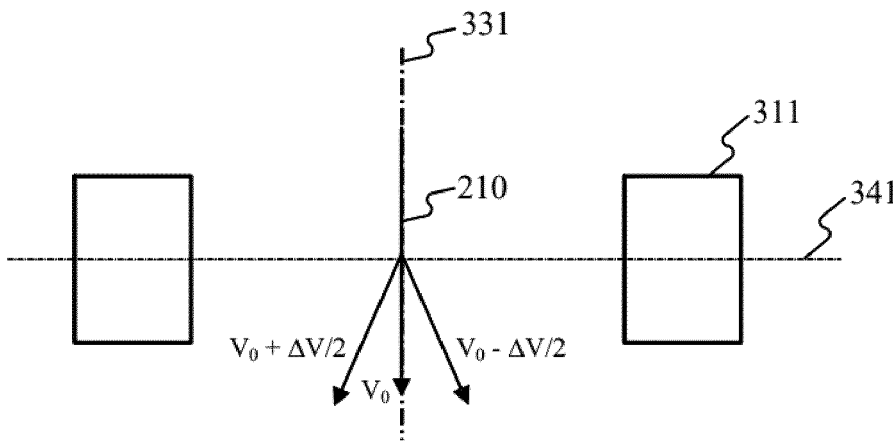

Reference is now made to FIG. 3B, which illustrates a dispersion device 311 consistent with embodiments of the present disclosure. Dispersion device 311, similar to dispersion device 310, comprises an electrostatic deflector and a magnetic deflector capable of generating a corresponding electrostatic dipole field E2 and magnetic dipole field B2. The electrostatic deflector and magnetic deflector can be arranged wherein E2 and B2 are superposed substantially perpendicular to each other and to an optical axis 331. In dispersion device 311, electrostatic dipole field E2 and magnetic dipole field B2 can be controlled wherein the total force (Fe+Fm) can be substantially zero when changing E2 and B2. Accordingly, the nominal deflection angle is zero as illustrated in FIG. 3B. The deflection dispersion induced by dispersion device 311 at a dispersion plane 341 can be controlled by varying E2 and B2 while maintaining the deflection angle at zero.

Figure 3C:
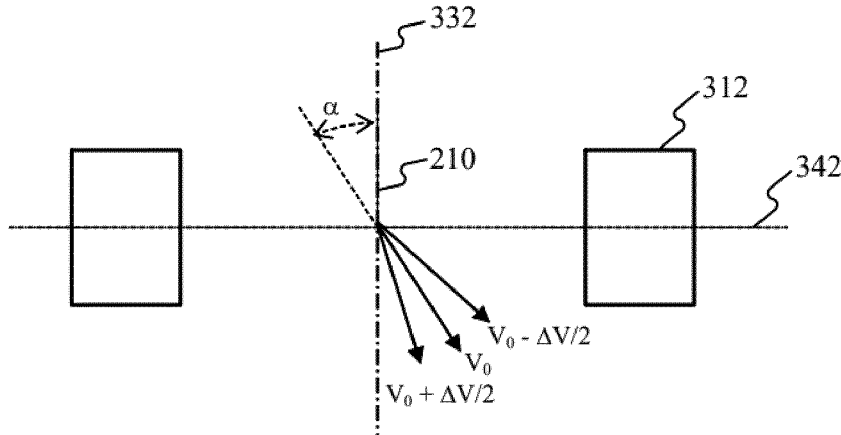

Reference is now made to FIG. 3C, which illustrates a dispersion device 312 consistent with embodiments of the present disclosure. Dispersion device 312, similar to dispersion devices 310 and 311, comprises an electrostatic deflector and a magnetic deflector capable of generating a corresponding electrostatic dipole field E2 and magnetic dipole field B2. The electrostatic deflector and magnetic deflector can be arranged wherein E2 and B2 are superposed substantially perpendicular to each other and to an optical axis 332. In dispersion device 312, electrostatic dipole field E2 and magnetic dipole field B2 can be controlled wherein the total force (Fe+Fm) can be a constant non-zero value when changing E2 and B2. Accordingly, the nominal deflection angle α is non-zero as illustrated in FIG. 3C. The deflection dispersion induced by dispersion device 312 at a dispersion plane 342 can be controlled by varying E2 and B2 while maintaining the deflection angle at α.

In the following discussion the terms deflection dispersion and dispersion may be used interchangeably to refer to any spreading of an electron beam caused by an energy dependence of deflection angle. The dispersion induced by dispersion device 311 or 312 can be controlled while maintaining a fixed deflection angle (equal to zero or a in the example of FIGS. 3B and 3C). When the dispersion device 311 or 312 is positioned upbeam of a beam separator 222, the dispersion of the dispersion device 311 or 312 can be used to compensate for dispersion induced in the beam separator 222. The dispersion of the dispersion device 311 or 312 can be arranged to be equal and opposite to the dispersion induced in the beam separator 222 for example. Examples of embodiments having a beam separator 222 and a corresponding dispersion device 311 or 312 upbeam of the beam separator 222 are described below with reference to FIG. 4A, 4B, 5-13.

Figure 8:
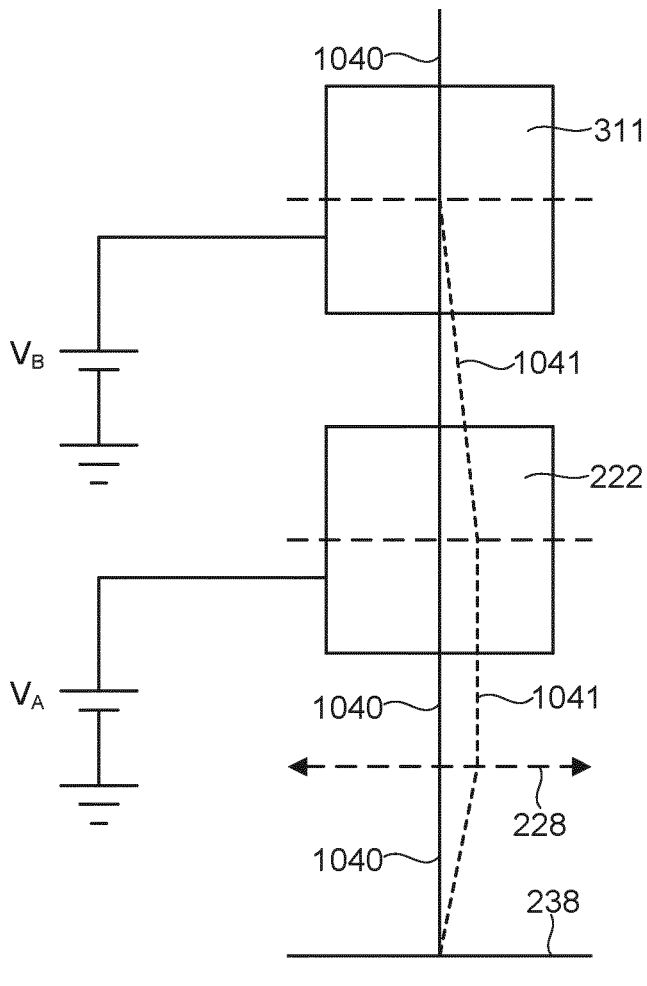
FIG. 8 is a schematic diagram illustrating a portion of an electron optical column comprising a beam separator and a dispersion device driven by separate voltage sources.
Figure 9:
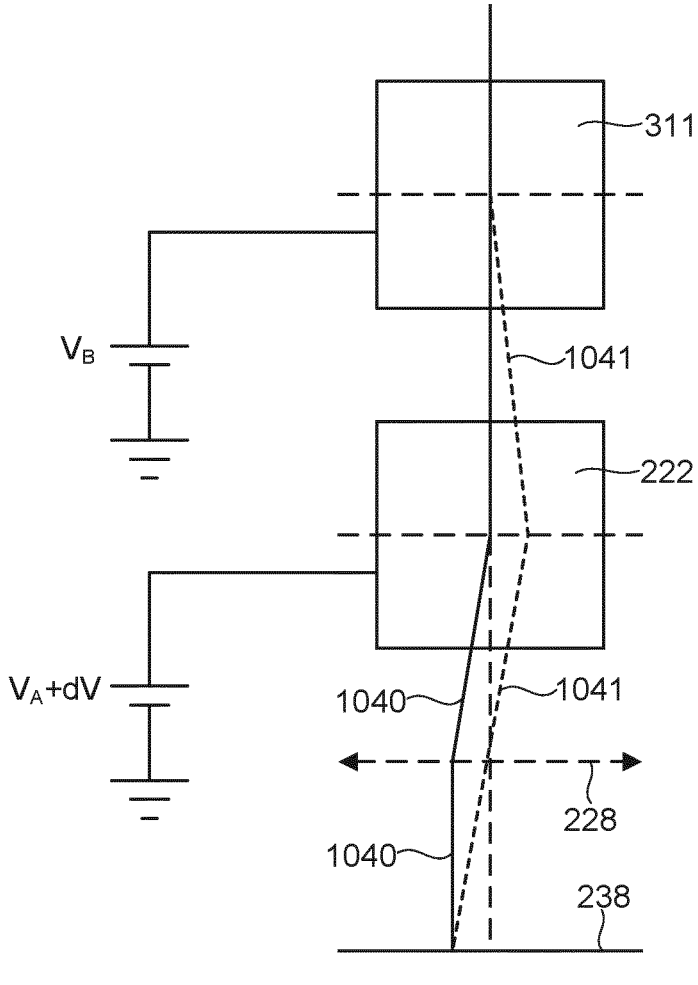
FIG. 9 is a schematic diagram illustrating the arrangement of FIG. 8 in the presence of voltage fluctuations in one of the voltage sources.

It has been found that dispersion compensation is highly sensitive to unwanted fluctuations in the voltage or current used to power the dispersion device 311, 312 or beam separator 222. FIG. 8 depicts an example arrangement in which a dispersion device 311 is provided upbeam from a beam separator 222. In this example, the beam separator 222 and dispersion device 311 are Wien filters. A Wien filter is an electron optical component that applies crossed electric and magnetic fields. The electric and magnetic fields may be powered by respective voltage and current sources, although for ease of illustration only the voltage source is depicted. The crossed electric and magnetic fields can be arranged to provide a deflector having a tunable pass velocity (or pass energy) for electrons passing through the filter. For electrons having a selected nominal velocity, the electric and magnetic forces cancel and the electron is not deflected by the filter. Electrons having velocities below or above the nominal velocity will be deflected. A single Wien filter can be used to separate a primary electron beam from a secondary electron beam because the primary electrons and secondary electrons pass through the Wien filter in different directions. The primary electrons and secondary electrons are thus affected differently by the magnetic field applied by the Wien filter. For example, in a case where a Wien filter is configured to direct primary electrons along an optical axis onto a sample, the Wien filter will deflect the secondary electrons away from the optical axis. A single Wien filter causes dispersion in an electron beam due to the inherent spread in the velocities of electrons in the beam. The dispersion leads to an angular spread of the electron beam at the sample 238. The angular spread results in a blurred focus of the electron beam, thereby reducing effective resolution. Providing a second Wien filter as a dispersion device 311 allows compensation of the dispersion effect. In the example shown in FIG. 8, the second Wien filter is configured to apply crossed electric and magnetic fields that are in opposite directions to the electric and magnetic fields applied by the Wien filter of the beam separator 222. The combined action of such a Wien filter doublet (formed by the beam separator 222 and dispersion device 311) is depicted in FIG. 8. A primary beam passes through both the dispersion device 311 and the beam separator 222 and impinges on a sample 238. A portion 1040 of the primary beam has a nominal beam energy corresponding to a pass energy of both the Wien filters. The portion 1040 of the primary beam thus passes undeflected through the Wien filters. A portion 1041 of the primary beam has a different beam energy. The portion 1041 of the primary beam is deflected first in one direction (to the right at the dispersion device 311) and then back in the opposite direction (to the left at the beam separator 222). Both portions 1040 and 1041 are subsequently focused to the same position on the sample 238. Nominal voltages $V_A$ and $V_B$ applied to electrodes in each Wien filter (and/or nominal currents applied to coils in each Wien filter) are selected so that the effects of dispersion cancel at the sample 238 to provide a sharp focused spot. In practice, significant fluctuations in the voltage and/or current used to power the Wien filters occur. A representative fluctuation dV in the voltage $V_A$ is depicted in FIG. 9. The fluctuation dV causes the portion 1040 of the primary beam to be deflected at the beam separator 222 (in contrast to the situation in FIG. 8). This deflection shifts the focus away from an intended focus position. The portion 1041 of the primary beam is also deflected so as to be focused at the shifted focus position. The fluctuation dV thus disturbs the focus at the sample 238. Fluctuations may also occur in the voltage $V_B$ and in the current applied to either or both of the Wien filters. These fluctuations may further disturb focusing at the sample 238.

Figure 10:
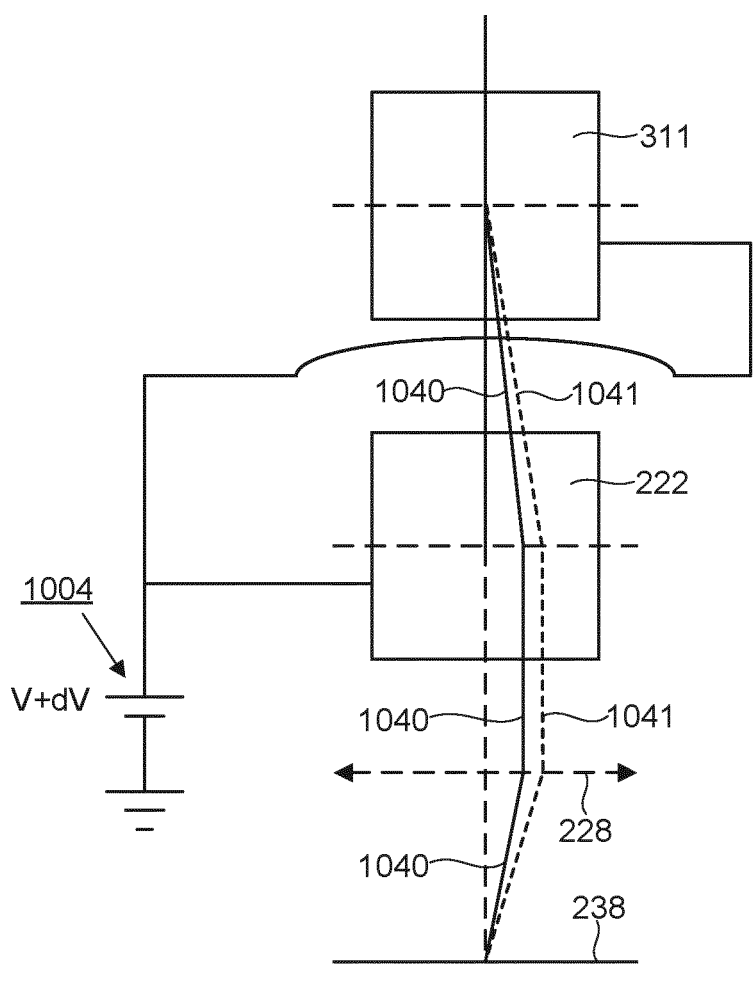
FIG. 10 is a schematic diagram illustrating a portion of an electron optical column comprising a beam separator and a dispersion device driven by a common voltage source with voltage fluctuations.

In some embodiments of the disclosure, the focus disturbance described above with reference to FIGS. 8 and 9 is reduced or removed by providing one or more common power supplies 1002, 1004 that each drive both the beam separator 222 and the dispersion device 311, 312. The common power supplies may comprise either or both of a common current source 1002 and a common voltage source 1004. An illustrative example is depicted in FIG. 10 (with only a common voltage source 1004 shown). More detailed example configurations are described with reference to FIG. 11-13. Since the electric and/or magnetic fields applied by the beam separator 222 and the dispersion device 311, 312 are oriented oppositely to each other, any fluctuations in these fields caused by fluctuations in the common power supplies will at least partially compensate for each other. Adjustable electronics (e.g. voltage and/or current dividers) can be used to optimize the levels of voltage and/or current to remove unwanted beam displacement at the sample 238. In the illustrative example of FIG. 10, a common voltage source 1004 is configured to provide a nominal voltage V and is subject to a fluctuation dV. In contrast to the arrangement shown in FIG. 9, the fluctuation dV is applied to both the beam separator 222 and the dispersion device 311. The fluctuation dV thus causes additional deflections of portions 1040 and 1041 of the primary beam at the dispersion device 311. The additional deflections compensate for respective deflections of portions 1040 and 1041 at the beam separator 222 caused by the fluctuation dV acting at the beam separator 222, thereby reducing or removing displacement of the focus position at the sample 238 caused by the fluctuation dV. In a typical configuration of the type depicted in FIG. 9, it is expected that, without compensation, power supply fluctuations could cause unwanted beam displacement comparable to SEM image resolution or even larger (e.g. of the order of 10 nm). Using the compensation scheme of FIG. 10, unwanted beam displacements can typically be reduced to well below the SEM image resolution (e.g. to 0.5 nm or lower).

Figure 11:
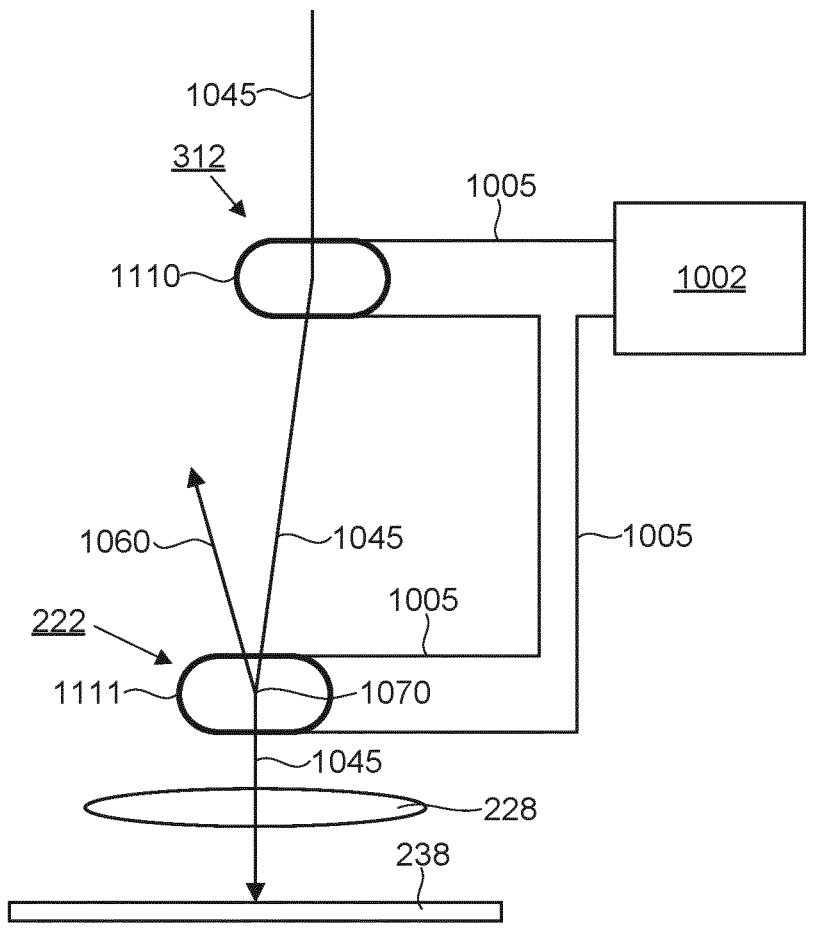
FIG. 11 is a schematic diagram illustrating a portion of an electron optical column comprising a beam separator and a dispersion device that are configured to generate magnetic fields using respective coils.
Figure 12:
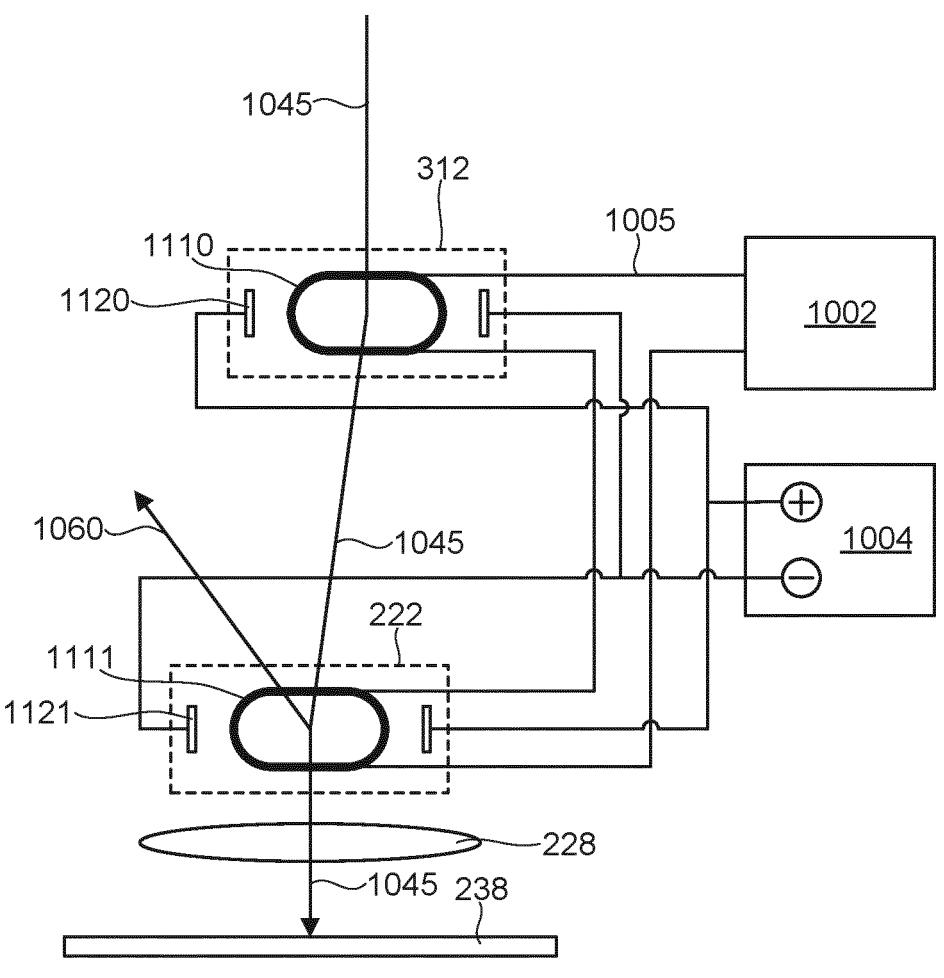
FIG. 12 is a schematic diagram illustrating a portion of an electron optical column comprising a beam separator and a dispersion device that are configured to generate crossed magnetic and electric fields using respective coils and electrodes.
Figure 13:
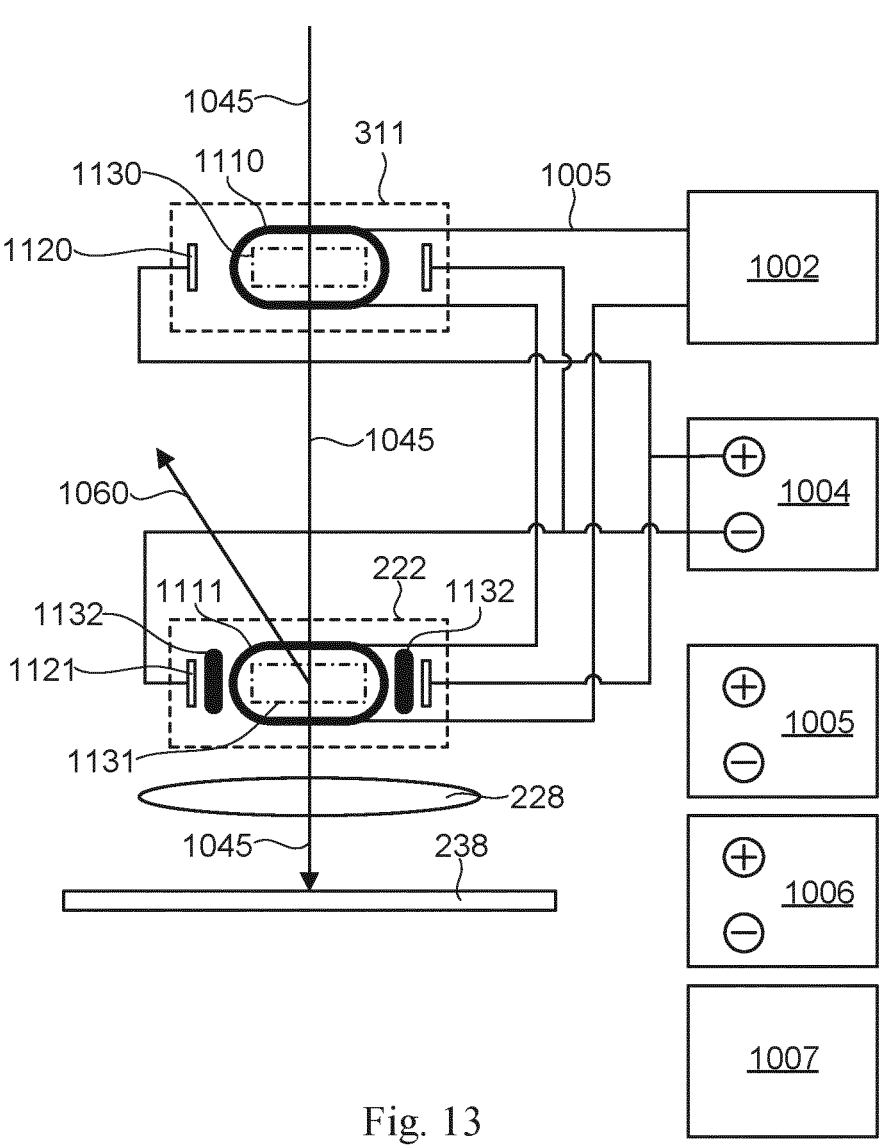
FIG. 13 is a schematic diagram illustrating a portion of an electron optical column comprising a beam separator and a dispersion device that are configured to generate crossed magnetic and electric fields using respective coils and electrodes and which further comprise adjustment electrodes and coils driven by independent power supplies.

FIGS. 4A, 4B and 5-7 describe example contexts in which beam separators 222 and corresponding dispersion devices 311, 312 may be driven by common power supplies. In each example, both a common current source 1002 and a common voltage source 1004 are depicted. It is also possible for each example to be implemented using only the common current source 1002 or only the common voltage source 1004. Connections between the common power supplies and the beam separators 222 and corresponding dispersion devices 311, 312 are not shown for clarity purposes in FIGS. 4A, 4B and 5-7. Example arrangements for these connections are shown in FIG. 11-13.

Figure 4A:
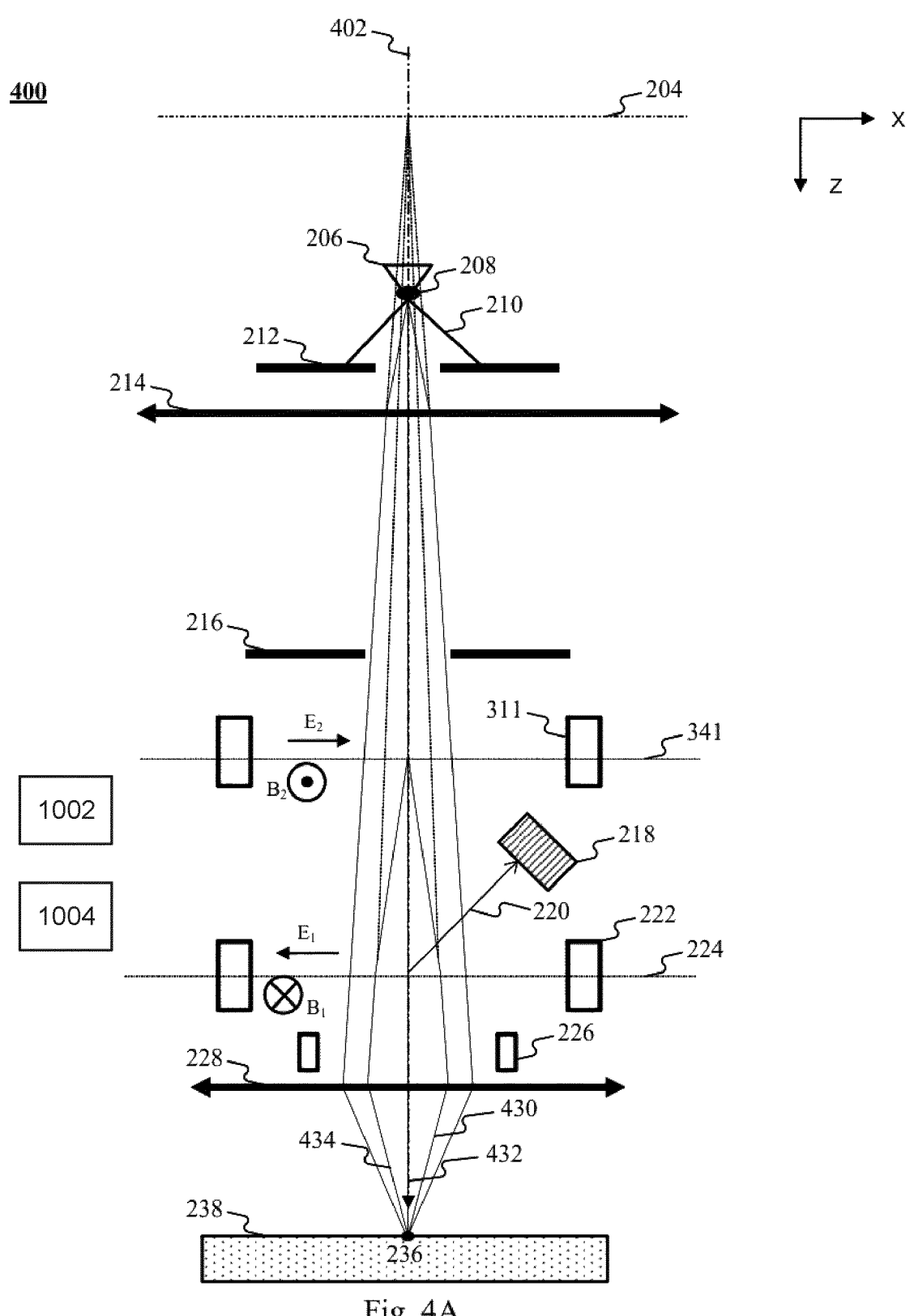
FIG. 4A, 4B are schematic diagrams illustrating an exemplary single-beam apparatus, consistent with embodiments of the present disclosure.
Figure 4B:
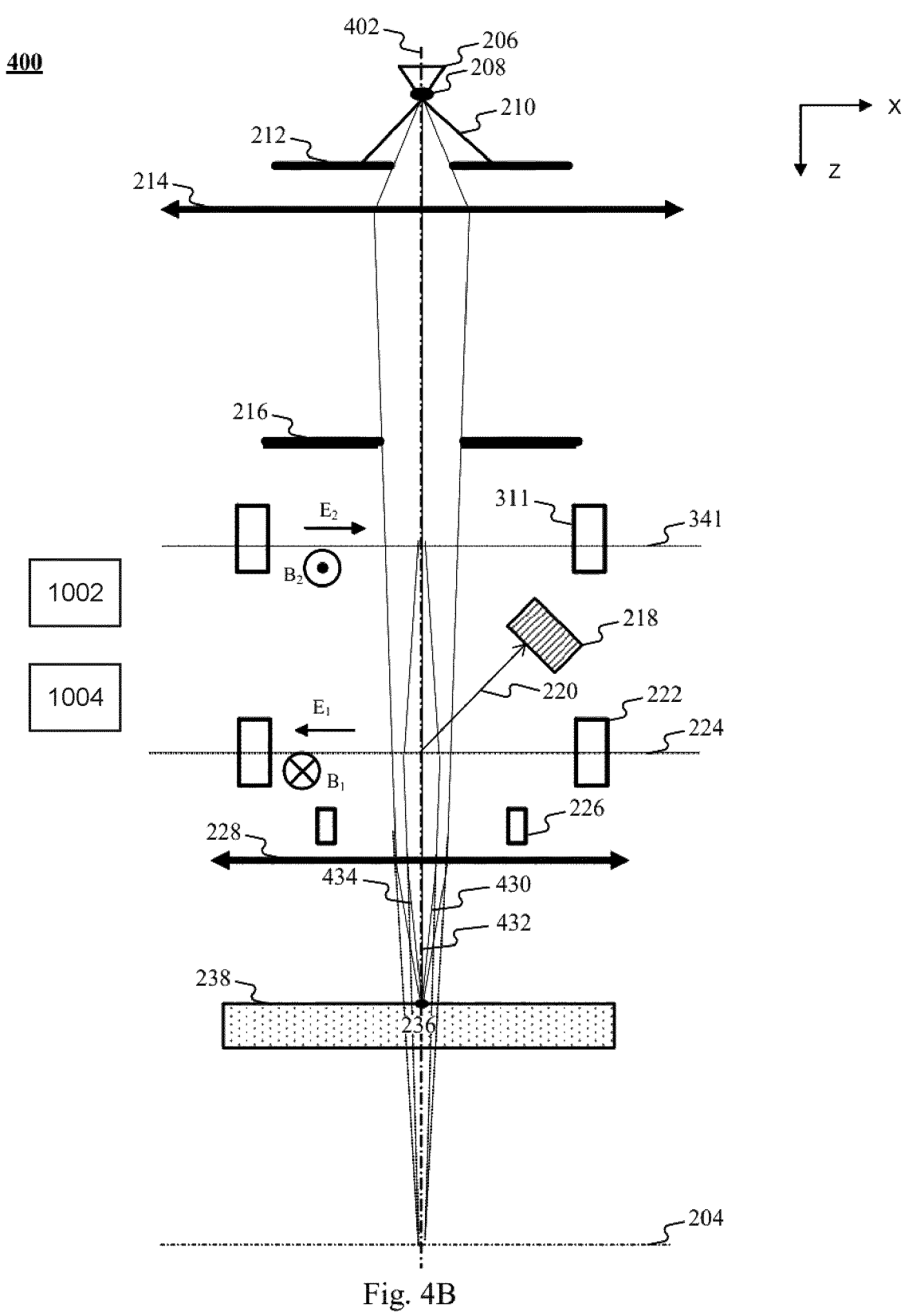

Reference is now made to FIG. 4A, which illustrates an exemplary single-beam apparatus 400, consistent with embodiments of the present disclosure. Single-beam apparatus 400 can be electron beam tool 104A of FIG. 2A further comprising dispersion device 311 of FIG. 3B. FIG. 4A illustrates operation of dispersion device 311 for a case where object plane 204 of objective lens 228 is above objective lens 228. FIG. 4B illustrates operation of dispersion device 311 for a case where object plane 204 of objective lens 228 is below objective lens 228. As described below, disclosed embodiments can compensate beam dispersion without limiting the operation mode of objective lens 228.

Single-beam apparatus 400 can comprise electron source 206, gun aperture 212, condenser lens 214, primary electron beam 210 emitted from electron source 206, beam-limit aperture 216, dispersion device 311, beam separator 222, deflection scanning unit 226, objective lens 228, secondary electron beam 220, and electron detector 218. Electron source 206, gun aperture 212, condenser lens 214, beam-limit aperture 216, dispersion device 311, beam separator 222, deflection scanning unit 226, and objective lens 228 can be aligned with optical axis 402 of single-beam apparatus 400.

As described above with reference to FIG. 3B, the nominal dispersion angle associated with dispersion device 311 is zero and primary electron beam 210 can pass straight through dispersion device 311. Dispersion device 311 can induce a beam dispersion based on the values of $E_2$ and $B_2$. Primary electron beam 210 can also pass straight through beam separator 222 of Wien filter type. Beam separator 222 can also induce a beam dispersion based on the values of $E_1$ and $B_1$. The beam dispersion induced by beam separator 222 can be referred to as main dispersion (MDS) and the beam dispersion induced by dispersion device 311 can be referred to as compensation dispersion (CDS). Dispersion device 311 can be configured and controlled to generate CDS opposite in direction to the MDS. For example, with reference to FIG. 4A, an electron with energy>nominal energy $V_0$ can be deflected towards −x direction by beam separator 222 and towards +x direction by dispersion device 311 (corresponding to beam path 430). An electron with energy<nominal energy $V_0$ can be deflected towards +x direction by beam separator 222 and towards −x direction by dispersion device 311 (corresponding to beam path 434). The magnitude of CDS generated by dispersion device 311 can be controlled to make electrons with energies different from nominal energy $V_0$ (for example, electrons corresponding to beam paths 430 and 434) to virtually focus on object plane 204. Accordingly, objective lens 228 focuses primary electron beam 210 onto sample 238 to form probe spot 236.

Figure 5:
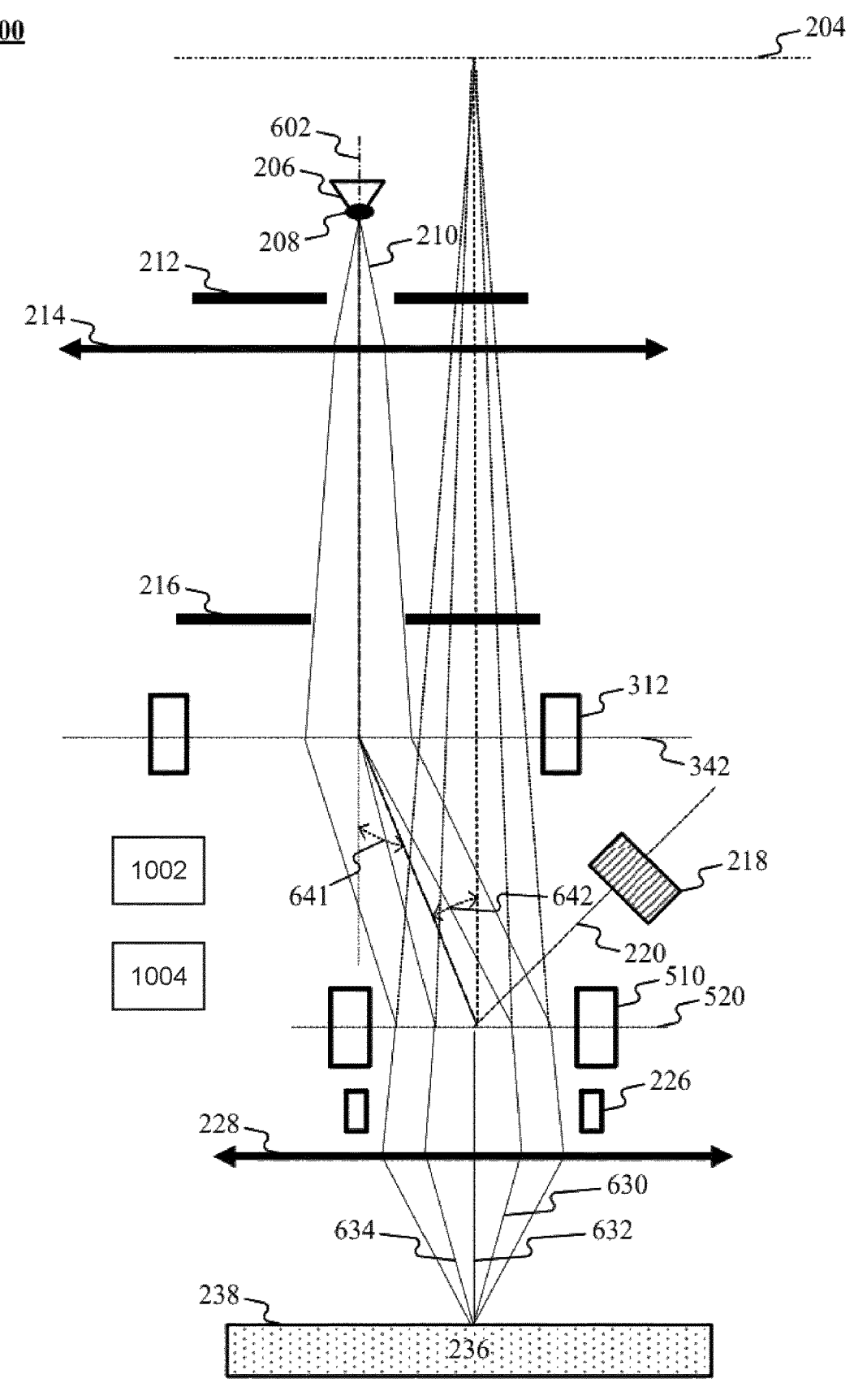
FIG. 5 is a schematic diagram illustrating an exemplary single-beam apparatus, consistent with embodiments of the present disclosure.

Reference is now made to FIG. 5 which illustrates an exemplary single-beam apparatus 600, consistent with embodiments of the present disclosure. Single-beam apparatus 600 can comprise electron source 206, gun aperture 212, condenser lens 214, primary electron beam 210 emitted from electron source 206, beam-limit aperture 216, dispersion device 312, beam separator 510, deflection scanning unit 226, objective lens 228, secondary electron beam 220, and electron detector 218. Beam separator 510 comprises a magnetic deflector and therefore associated deflection angle 642 has a non-zero value. Electron source 206, gun aperture 212, condenser lens 214, beam-limit aperture 216, dispersion device 312, beam separator 510, deflection scanning unit 226, and objective lens 228 can be aligned with respect to optical axis 602 of single-beam apparatus 600.

As described above with reference to FIG. 3C, the nominal dispersion angle associated with dispersion device 312 is non-zero and primary electron beam 210 can pass through dispersion device 312 with a nominal deflection angle 641 and with an associated beam dispersion CDS. For single-beam apparatus 600, an electron of primary electron beam 210 traveling along optical axis 602 with nominal energy $V_0$ can be deflected by angle 641 at deflection plane 342 (of dispersion device 312) and can be incident at deflection plane 520 (of beam separator 510) at an incident angle 641. An electron traveling along optical axis 602 with energy>$V_0$ can be incident at beam separator 510 with an incident angle<angle 641. An electron traveling along optical axis 602 with energy<$V_0$ can be incident at beam separator 510 with an incident angle>angle 641.

Beam separator 510 can deflect primary electron beam 210 with a nominal deflection angle 642 and an associated beam dispersion MDS. An electron with nominal energy $V_0$ can be deflected at deflection plane 520 by an angle 642. An electron with energy>$V_0$ can be deflected at an angle less than angle 642. An electron with energy<$V_0$ can be deflected at an angle greater than angle 642.

The CDS generated by dispersion device 312 can be controlled wherein the incident angle variation generated by CDS for electrons with different energies can compensate the deflection angle variation generated by MDS. Accordingly, the electrons with different energies can be controlled to virtually focus on object plane 204. Further, objective lens 228 can focus the electrons with different energies (corresponding to beam paths 630, 632, and 634) onto sample 238 to form probe spot 236. Dispersion device 312 comprises an electrostatic deflector and a magnetic deflector and the CDS can therefore be varied while maintaining deflection angle 641 constant. Therefore the CDS can be changed to match the position variation of object plane 204 and no restrictions are placed on operation modes of objective lens 228. Further dispersion device 312 can be controlled to maintain angles 641 and 642 equal. So optical axis 602 can be maintained parallel to optical axis of beam separator 510. This can simplify the arrangement and alignment of various components of single-beam apparatus 600.

Figure 6:
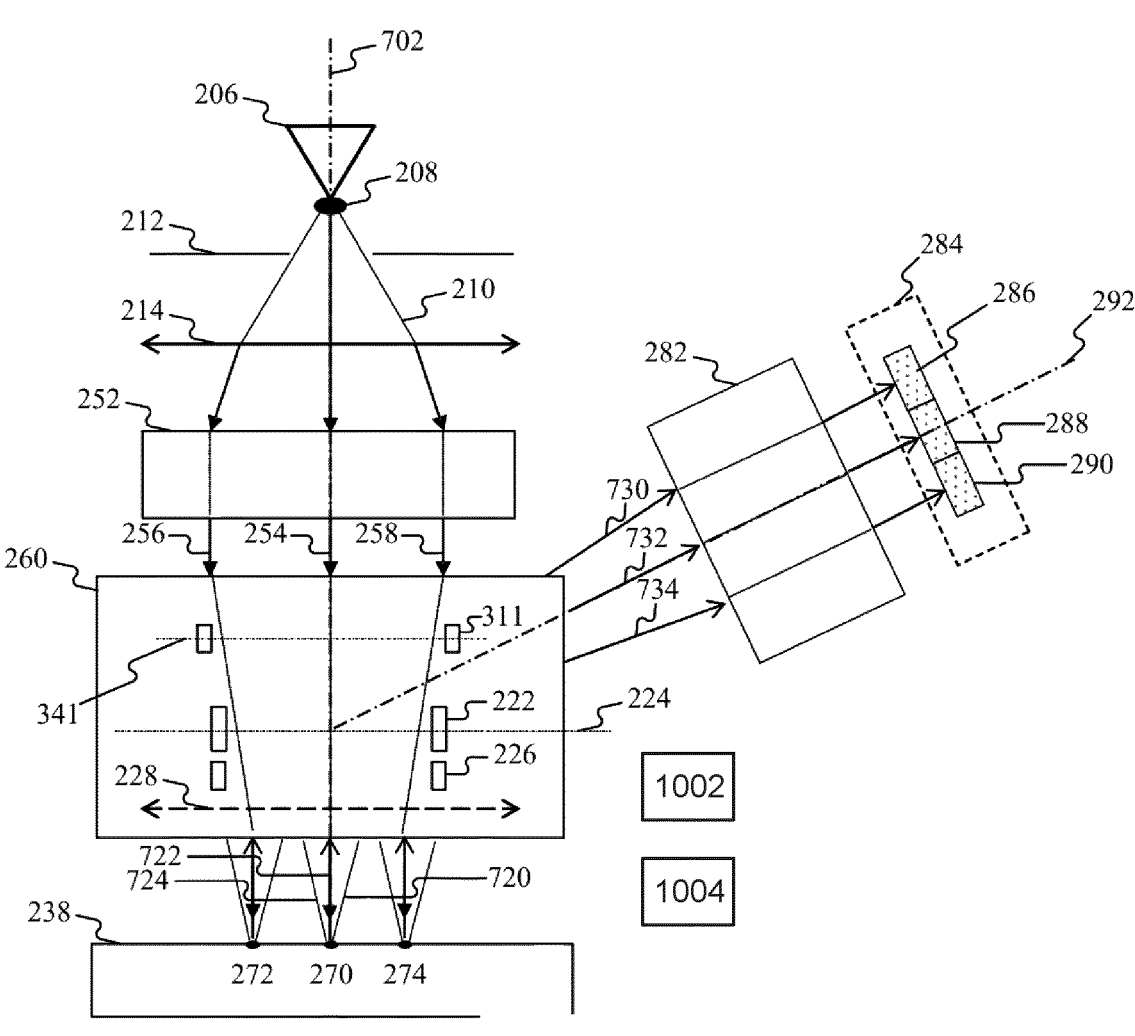
FIG. 6 is a schematic diagram illustrating an exemplary multi-beam apparatus, consistent with embodiments of the present disclosure.

Reference is now made to FIG. 6, which illustrates an exemplary multi-beam apparatus 700, consistent with embodiments of the present disclosure. Multi-beam apparatus 700 can be electron beam tool 104A of FIG. 2B further comprising dispersion device 311 of FIG. 3B.

Multi-beam apparatus 700 can comprise electron source 206, gun aperture 212, condenser lens 214, primary electron beam 210 emitted from electron source 206, source conversion unit 252, plurality of beamlets 254, 256, and 258 of primary electron beam 210, primary projection optical system 260, multiple secondary electron beams 730, 732, and 734, secondary optical system 282, and electron detection device 284. Primary projection optical system 260 can comprise objective lens 228. Electron detection device 284 can comprise detection elements 286, 288, and 290. Dispersion device 311, beam separator 222 and deflection scanning unit 226 can be placed inside primary projection optical system 260.

Electron source 206, gun aperture 212, condenser lens 214, source conversion unit 252, dispersion device 311, beam separator 222, deflection scanning unit 226, and objective lens 228 can be aligned with a primary optical axis 702 of apparatus 700. Secondary optical system 282 and electron detection device 284 can be aligned with a secondary optical axis 292 of apparatus 700.

As described above with reference to FIG. 3B, the nominal dispersion angle associated with dispersion device 311 is zero and beamlets 254, 256, and 258 can pass straight through dispersion device 311. Dispersion device 311 can induce a CDS for beamlets 254, 256, and 258. Dispersion device 311 can be placed above primary projection optical system 260.

Beamlets 254, 256, and 258 can also pass straight through beam separator 222 of Wien filter type. Beam separator 222 can induce a MDS for the beamlets. As described above with reference to FIG. 4A and FIG. 4B, dispersion device 311 can be configured and controlled to generate CDS opposite in direction to the MDS. The magnitude of CDS generated by dispersion device 311 can be controlled to make dispersed electrons of each beamlet (for example, electrons corresponding to beam paths 720 and 724) virtually focus on object plane of objective lens 228. Accordingly, objective lens 228 focuses the dispersed electrons of beamlets 254, 256, and 258 onto sample 238 to form corresponding probe spots 270, 272, and 274.

Figure 7:
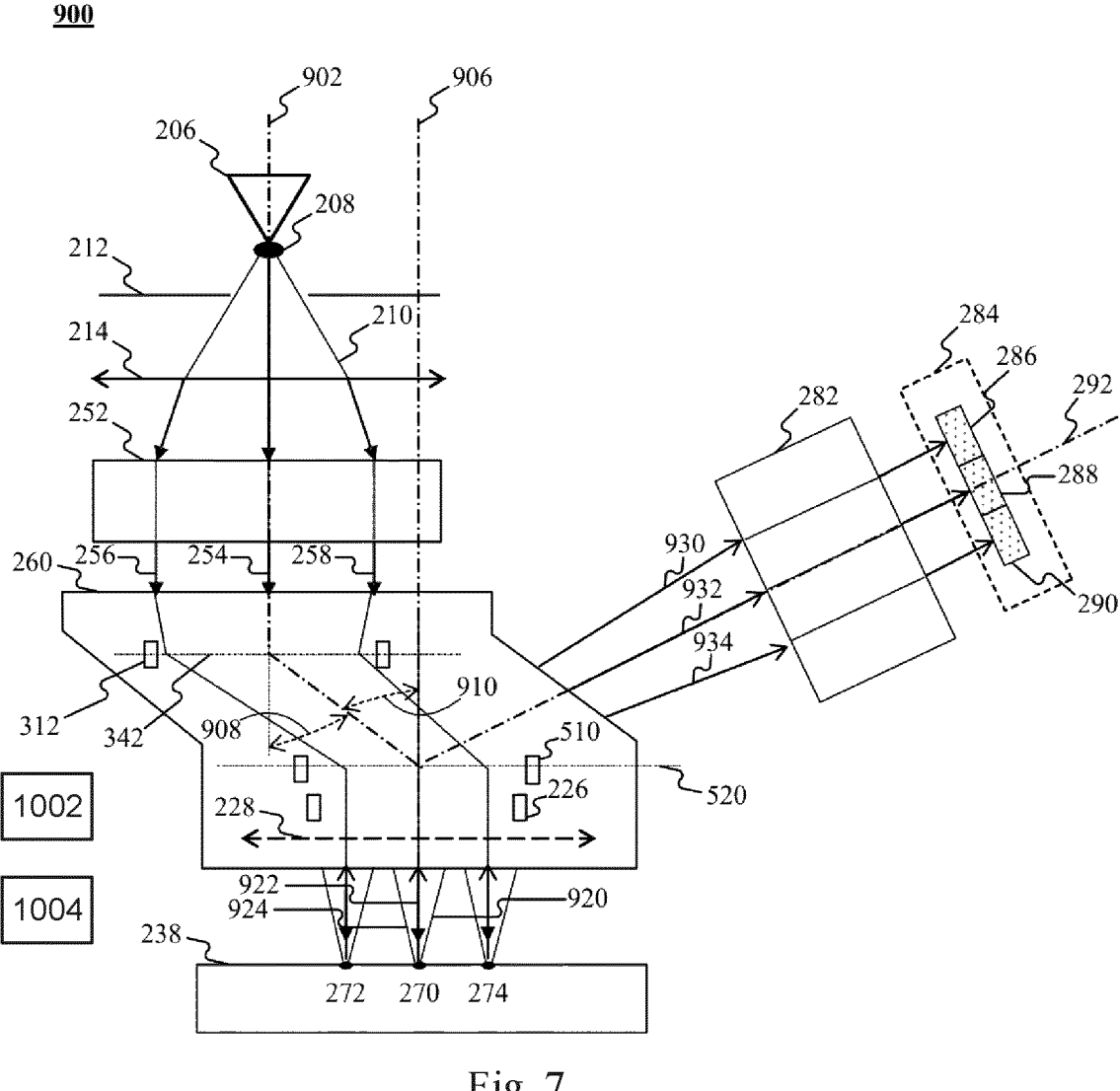
FIG. 7 is a schematic diagram illustrating an exemplary multi-beam apparatus, consistent with embodiments of the present disclosure.

Reference is now made to FIG. 7, which illustrates an exemplary multi-beam apparatus 900, consistent with embodiments of the present disclosure. Multi-beam apparatus 900 can comprise electron source 206, gun aperture 212, condenser lens 214, primary electron beam 210 emitted from electron source 206, source conversion unit 252, plurality of beamlets 254, 256, and 258 of primary electron beam 210, primary projection optical system 260, multiple secondary electron beams 930, 932, and 934, secondary optical system 282, and electron detection device 284. Primary projection optical system 260 can comprise objective lens 228. Electron detection device 284 can comprise detection elements 286, 288, and 290. Dispersion device 312, beam separator 510 and deflection scanning unit 226 can be placed inside primary projection optical system 260.

Electron source 206, gun aperture 212, condenser lens 214, source conversion unit 252, dispersion device 312, beam separator 510, deflection scanning unit 226, and objective lens 228 can be aligned with a primary optical axis 902 of apparatus 900. Secondary optical system 282 and electron detection device 284 can be aligned with a secondary optical axis 292 of apparatus 900.

As described above with reference to FIG. 3C, the nominal dispersion angle associated with dispersion device 312 is non-zero and primary electron beam 210 can pass through dispersion device 312 with a nominal deflection angle 908 and with an associated beam dispersion CDS. An electron of beamlets 254, 256, and 258 traveling along optical axis 902 with nominal energy $V_0$ can be incident at beam separator 510 with an incident angle 908. An electron traveling along optical axis 902 with energy>$V_0$ can be incident at beam separator 510 with an incident angle<angle 908. An electron traveling along optical axis 902 with energy<$V_0$ can be incident at beam separator 510 with an incident angle>angle 908. Dispersion device 312 can be placed above primary projection optical system 260.

Beam separator 510 can deflect beamlets 254, 256, and 258 with a nominal deflection angle equal to angle 910 and an associated beam dispersion MDS. An electron with nominal energy $V_0$ can be deflected at an angle equal to angle 910. An electron with energy>$V_0$ can be deflected at an angle less than angle 910. An electron with energy<$V_0$ can be deflected at an angle greater than angle 910.

The CDS generated by dispersion device 312 can be controlled wherein the incident angle variation generated by CDS for electrons with different energies can compensate the deflection angle variation generated by MDS. Accordingly, the electrons with different energies can be controlled to virtually focus on the object plane of objective lens 228. Further, objective lens 228 can focus the electrons with different energies (corresponding to beam paths 920, 922, and 924) onto sample 238 to form corresponding probe spots 270, 272, and 274. Dispersion device 312 comprises an electrostatic deflector and a magnetic deflector and the CDS can therefore be varied while maintaining deflection angle 908 constant. Therefore the CDS can be changed to match the position variation of object plane 204 and no restrictions are placed on operation modes of objective lens 228. Further dispersion device 312 can be controlled to maintain that angles 908 and 910 are equal. So optical axis 902 can be maintained parallel to optical axis 906 of beam separator 510. This can simplify the arrangement and alignment of various components of single-beam apparatus 900.

FIG. 11-13 depict portions of further examples of an electron optical column having one or more common power supplies 1002, 1004 for driving a beam separator 222 and a dispersion device 311, 312. The optical column is configured to direct a beam of primary electrons along a primary beam path 1045 onto a sample 238. The optical column comprises a beam separator 222. The beam separator may take any of the forms described above with reference to FIG. 2-10. The beam separator 222 diverts away from the primary beam path 1045 a beam 1060 of secondary electrons emitted from the sample 238 along the primary beam path 1045. In the example of FIG. 11, the diversion away from the primary beam path 1045 happens at point 1070. A dispersion device 311, 312 is provided upbeam from the beam separator 222. The dispersion device 311, 312 may take any of the forms described above with reference to FIG. 3-10. The dispersion device 311, 312 compensates for dispersion induced in the primary beam by the beam separator 222. One or more common power supplies 1002, 1004 are provided for driving both the beam separator 222 and the dispersion device 311, 312.

In some arrangements, as exemplified in FIG. 11, the beam separator 222 diverts the beam 1060 of secondary electrons using a magnetic field generated by a beam separator coil 1111. The magnetic field may be perpendicular to an optical axis of the column. In the example shown, the magnetic field is perpendicular to the page. The dispersion device 312 at least partially compensates for the dispersion induced by the beam separator 222 (e.g. by the beam separator coil 1111) using a magnetic field generated by a dispersion device coil 1110. In arrangements of this type, the one or more common power supplies may comprise a common current source 1002 that drives both the beam separator coil 1111 and the dispersion device coil 1110. When an electric current is driven through the coils the coils generate a corresponding magnetic field. The beam separator coil 1111 and the dispersion device coil 1110 may be formed on respective magnetic cores. The magnetic field generated by the beam separator coil 1111 is oppositely oriented to the magnetic field generated by the dispersion device coil 1110. In an embodiment, the beam separator coil 1111 and the dispersion device coil 1110 are connected in series with each other and to the common current source 1002, as depicted schematically by connections 1005. A current divider arrangement may be provided to adjust the relative sizes of currents in the beam separator coil 1111 and the dispersion device coil 1110. Alternatively or additionally, a number of turns of either or both coils may be changed to adjust the relative sizes of magnetic excitations in the beam separator coil 1111 and the dispersion device coil 1110.

In some arrangements, as exemplified in FIG. 12-13, the beam separator 222 comprises beam separator electrodes 1121. The beam separator electrodes 1121 apply an electric field to primary electrons in the beam separator 222. The electric field is such as to apply a force to the primary electrons that is opposite in direction to a force applied to the primary electrons by the magnetic field generated by the beam separator coil 1111. In some arrangements, as discussed above with reference to FIG. 10 for example and exemplified in FIG. 13, the force applied by the electric field to a portion of the primary beam in the beam separator 222 having a selected nominal energy is substantially equal in magnitude to the force applied to the same portion of the primary beam by the magnetic field. In arrangements of this type, the beam separator 222 may be referred to as a Wien filter. The portion of the primary beam having the nominal energy will pass through the beam separator 222 undeflected. In other arrangements, as exemplified in FIG. 12, the force applied by the electric field is different in magnitude to the force applied by the magnetic field for all portions of the beam. The force applied by the magnetic field may, for example, be twice as strong as the force applied by the electric field to minimize dispersion. This condition arises because the angle of deflection of electrons with mass m, charge q, and speed v in crossed electric and magnetic fields applied over a distance l is given by $\theta$=ql(vB−E)/(mv²), and d$\theta$/dv=0 when vB=2E. In this situation, a deflection angle $\theta_B$ that would be imparted by the magnetic field on its own would be twice as large as a deflection angle $\theta_E$ that would be imparted by the electric field on its own and in the opposite direction, such that $\theta_B$=−2$\theta_E$. The beam 1060 of secondary electrons emitted from the sample 238 is travelling in the opposite direction to the primary beam and is deflected in the beam separator 222 by both the magnetic field and the electric field in the same direction. The cumulative effect of the two forces results in a larger deflection of −3$\theta_E$ or more (because the secondary electrons may have lower energy than the primary electrons). As discussed above with reference to FIG. 3C, arranging for the electric and magnetic fields not to cancel allows a fixed non-zero deflection to be applied to the primary beam.

In some embodiments, the dispersion device comprises dispersion device electrodes 1120. The dispersion device electrodes 1120 apply an electric field to primary electrons in the dispersion device 311, 312. The electric field is such as to apply a force to the primary electrons that is opposite in direction to a force applied to the primary electrons by the magnetic field generated by the dispersion device coil 1110. In some arrangements, as discussed above with reference to FIG. 10 for example and exemplified in FIG. 13, the force applied by the electric field to a portion of the primary beam in the dispersion device 311 having a selected nominal energy is substantially equal in magnitude to the force applied to the same portion of the primary beam by the magnetic field. In arrangements of this type, the dispersion device 311 may be referred to as a Wien filter. The portion of the primary beam having the nominal energy will pass through the dispersion device 311 undeflected. In other arrangements, as exemplified in FIG. 12, the force applied by the electric field is different in magnitude to the force applied by the magnetic field for all portions of the beam. The force applied by the magnetic field may, for example, be twice as strong as the force applied by the electric field. As discussed above with reference to FIG. 3C, arranging for the electric and magnetic fields not to cancel in this manner allows a fixed non-zero deflection to be applied to the primary beam.

In some embodiments, as exemplified in FIG. 12-13, the one or more common power supplies comprises a common voltage source 1004 configured to drive both the beam separator electrodes 1121 and the dispersion device electrodes 1120. The common voltage source 1004 may thus apply a voltage (potential difference) across both the beam separator electrodes 1121 and the dispersion device electrodes 1120. The beam separator electrodes 1121 and the dispersion device electrodes 1120 may be connected in parallel relative to each other, as depicted schematically in FIGS. 12 and 13. The beam separator electrodes 1121 and the dispersion device electrodes 1120 may be connected so that the voltage across the beam separator electrodes 1121 is opposite in polarity to the voltage across the dispersion device electrodes 1120. A voltage divider arrangement may be provided to adjust the relative sizes of the electric fields in the beam separator electrodes 1121 and the dispersion device electrodes 1120. Alternatively or additionally, positions and/or geometries of either or both of the beam separator electrodes 1121 and the dispersion device electrodes 1120 may be changed to adjust the relative influences of the beam separator electrodes 1121 and the dispersion device electrodes 1120 on electrons passing through the beam separator 222 and dispersion device 311, 312. For example, the electrodes may be made longer or shorter along the beam path to change the period during which the electric field acts on the electrons or a separation between the electrodes may be changed to vary the electric field for a given applied voltage.

In some embodiments, as exemplified in FIG. 13, either or both of the beam separator 222 and the dispersion device 311 comprises adjustment electrodes 1130, 1131. The adjustment electrodes 1130, 1131 apply an electric field to primary electrons that is perpendicular or oblique to the electric field applied by the beam separator electrodes 1121 or the dispersion device electrodes 1120. In the example of FIG. 13, adjustment electrodes 1130, 1131 are provided in both the beam separator 222 and the dispersion device 311. The adjustment electrodes 1130, 1131 are parallel to the plane of the page and therefore generate an electric field perpendicular to the plane of the page. The force applied to the primary electrons by the adjustment electrodes 1130, 1131 is thus perpendicular to the forces applied by the beam separator coil 1111, the dispersion device coil 1110, the beam separator electrodes 1121 and the dispersion device electrodes 1120. The adjustment electrodes 1130, 1131 may be used for fine tuning of the beam of primary electrons by deflection in the direction perpendicular to the forces applied by the beam separator coil 1111, the dispersion device coil 1110, the beam separator electrodes 1121 and the dispersion device electrodes 1120. The electric fields needed to perform the fine tuning are likely to be significant smaller than the electric fields applied in the beam separator electrodes 1121 and the dispersion device electrodes 1120. Errors due to fluctuations in the power supply used to power the adjustment electrodes may thus have only a limited negative effect on performance. In embodiments of this type, independent power supplies 1005 and 1006 may be provided to respectively drive the adjustment electrodes 1130, 1131. The independent power supplies 1005 and 1006 are independent of the one or more common power supplies 1002, 1004.

In some arrangements, one or more adjustment coils 1132 may be provided at the beam separator 222 and/or at the dispersion device 311, 312. In the example of FIG. 13, the beam separator 222 comprises a pair of adjustment coils 1132. In other arrangements, the dispersion device 311, 312 may comprise one or more adjustment coils or the beam separator 222 and the dispersion device 311, 312 may each comprise one or more adjustment coils. The adjustment coils 1132 apply a magnetic field to primary electrons that is perpendicular or oblique to the magnetic field applied by the beam separator coil 1111 or dispersion device coil 1110. The adjustment coils 1132 may be used for fine tuning the beam of primary electrons by deflection in the direction perpendicular to the forces applied by the beam separator coil 1111, the dispersion device coil 1110, the beam separator electrodes 1121 and the dispersion device electrodes 1120. The magnetic fields needed to perform the fine tuning are likely to be significant smaller than the magnetic fields applied in the beam separator coil 1111 and the dispersion device coil 1110. Errors due to fluctuations in the power supply used to power the adjustment coils may thus have only a limited negative effect on performance. In embodiments of this type, an independent power supply 1007 may be provided to drive the adjustment coil or adjustment coils 1132 at the beam separator 222 or dispersion device 312. The independent power supply 1007 is independent of the one or more common power supplies 1002, 1004 and, where present, of power supplies 1005 and 1006 for driving adjustment electrodes 1130, 1131. Connections between the independent power supplies 1005, 1006 and 1007 and the adjustment electrodes 1130, 1131 and adjustment coils 1132 are omitted in FIG. 13 for clarity.

Various arrangements are described above in which a beam separator 222 and dispersion device 311, 312 are provided in series electron-optically. One or more beams of primary electrons pass first through the dispersion device 311, 312 and then through the beam separator 222 before reaching the sample 238. The dispersion device 311, 312 compensates in advance for at least a portion of dispersion induced in the primary beam by the beam separator 222. The dispersion device 311, 312 is a feed-forward corrector or compensator. The compensation is introduced to the beam prior to the beam separator 222 operating on the beam 311, 312. For efficient compensation, it is desirable for the beam separator 222 and dispersion device 311, 312 to be directly consecutive along the primary beam path. In such arrangements, no other element having a significant influence on electrons is therefore present between the beam separator 222 and dispersion device 311, 312. Any region between the beam separator 222 and dispersion device 311, 312 is free of any element that could significantly alter a trajectory or energy of electrons, such as another electron-optical element, an obstacle or a filter. Preferably, trajectories of electrons in the primary beam are parallel to each other between the beam separator 222 and dispersion device 311, 312. The trajectories are such that no intermediate focus is formed between the beam separator 222 and dispersion device 311, 312. Such an electron-optical design may be described as asymmetric with respect to the beam separator 222 and dispersion device. The beam path is continuous between the beam separator 222 and dispersion device 311, 312 and any focus such as intermediate focus is upbeam or downbeam along the primary beam path of both beam separator 222 and the dispersion device 311, 312.

The beam separator 222 and dispersion device 311, 312 may be substantially symmetrical with respect to each other. For example, an electric field applied by the beam separator 222 may be substantially equal in size and opposite in direction to an electric field applied by the dispersion device 311, 312. A magnetic field applied by the beam separator 222 may be substantially equal in size and opposite in direction to a magnetic field applied by the dispersion device 311, 312. A length of a portion of the primary beam path along which electrons are influenced by the beam separator 222 may be substantially the same as a length of a portion of the primary beam path along which electrons are influenced by the dispersion device 311, 312. The beam separator 222 and the dispersion device 311, 312 may thus have substantially the same size. Making the influences of the electric and/or magnetic fields symmetric in this manner may facilitate optimum compensation of dispersion. However, the inventors have found that effective levels of compensation may be achieved even where some asymmetry is present. An effective level of compensation may include correction but not entire elimination of the dispersion generated by the beam separator. This makes it possible to achieve a desirable balance between space saving and dispersion compensation. For example, in some arrangements the dispersion device 311, 312 is made deliberately smaller than the beam separator 222 to allow space to be saved in the region where the dispersion device 311, 312 is to be located. Thus, the dispersion device 311, 312 may be configured to influence electrons along a smaller portion of the primary beam path than the beam separator dispersion device 311 and can thereby be made smaller.

It will be appreciated that the present invention is not limited to the exact construction that has been described above and illustrated in the accompanying drawings, and that various modifications and changes can be made without departing from the scope thereof. It is intended that the scope of the invention should only be limited by the appended claims and clauses. There is provided the following clauses:

Clause 1: An electron optical column configured to direct a beam of primary electrons along a primary beam path onto a sample, comprising: a beam separator configured to divert away from the primary beam path a beam of secondary electrons emitted from the sample along the primary beam path; a dispersion device upbeam from the beam separator, the dispersion device being configured to compensate for dispersion induced in the primary beam by the beam separator; and one or more common power supplies each configured to drive both the beam separator and the dispersion device.

Clause 2: The column of clause 1, wherein: the beam separator is configured to divert the beam of secondary electrons using a magnetic field generated by a beam separator coil; and the dispersion device is configured to compensate for the dispersion using a magnetic field generated by a dispersion device coil.

Clause 3: The column of clause 2, wherein the one or more common power supplies comprises a common current source configured to drive both the beam separator coil and the dispersion device coil.

Clause 4: The column of clause 2 or 3, wherein the magnetic field generated by the beam separator coil is oppositely oriented to the magnetic field generated by the dispersion device coil.

Clause 5: The column of any of clauses 2-4, wherein: the beam separator comprises beam separator electrodes configured to apply an electric field to primary electrons in the beam separator; and the electric field is such as to apply a force to the primary electrons that is opposite in direction to a force applied to the primary electrons by the magnetic field generated by the beam separator coil.

Clause 6: The column of clause 5, wherein the force applied by the electric field to a portion of the primary beam in the beam separator having a selected nominal energy is substantially equal in magnitude to the force applied to the same portion of the primary beam by the magnetic field.

Clause 7: The column of clause 5 or 6, wherein: the dispersion device comprises dispersion device electrodes configured to apply an electric field to primary electrons in the dispersion device; and the electric field is such as to apply a force to the primary electrons that is opposite in direction to a force applied to the primary electrons by the magnetic field generated by the dispersion device coil.

Clause 8: The column of clause 7, wherein the force applied by the electric field to a portion of the primary beam in the dispersion device having a selected nominal energy is substantially equal in magnitude to the force applied to the same portion of the primary beam by the magnetic field.

Clause 9: The column of clause 7 or 8, wherein the one or more common power supplies comprises a common voltage source configured to drive both the beam separator electrodes and the dispersion device electrodes.

Clause 10: The column of any of clauses 5-9, wherein either or both of the beam separator and the dispersion device comprises adjustment electrodes configured to apply an electric field to primary electrons that is perpendicular or oblique to the electric field applied by the beam separator electrodes or the dispersion device electrodes.

Clause 11: The column of clause 10, further comprising at least one independent power supply configured to drive the adjustment electrodes, each independent power supply being independent of the one or more common power supplies.

Clause 10: The column of any preceding claim, wherein the dispersion device is configured to influence electrons along a smaller portion of the primary beam path than the beam separator.

Clause 13: The column of any preceding claim, wherein the beam separator and dispersion device are directly consecutive along the primary beam path.

Clause 14: A charged particle assessment tool comprising the column of any of clauses 1-13.

Clause 15: A method of directing a beam of primary electrons along a primary beam path onto a sample, comprising: using a beam separator to divert away from the primary beam path a beam of secondary electrons emitted from the sample along the primary beam path; and using a dispersion device upbeam from the beam separator to compensate for dispersion induced in the primary beam by the beam separator, wherein one or more common power supplies are used to drive both the beam separator and the dispersion device.

The invention claimed is:

1. An electron optical column configured to direct a beam of primary electrons along a primary beam path onto a sample, comprising:

a beam separator configured to divert away from the primary beam path a beam of secondary electrons emitted from the sample along the primary beam path;

a dispersion device upbeam from the beam separator, the dispersion device being configured to compensate for dispersion induced in the primary beam by the beam separator; and one or more common power supplies each configured to drive both the beam separator and the dispersion device.

2. The column of claim 1, wherein:

the beam separator is configured to divert the beam of secondary electrons using a magnetic field generated by a beam separator coil; and the dispersion device is configured to compensate for the dispersion using a magnetic field generated by a dispersion device coil.

3. The column of claim 2, wherein the one or more common power supplies comprises a common current source configured to drive both the beam separator coil and the dispersion device coil.

4. The column of claim 2, wherein the magnetic field generated by the beam separator coil is oppositely oriented to the magnetic field generated by the dispersion device coil.

5. The column of claim 2, wherein:
the beam separator comprises beam separator electrodes configured to apply an electric field to primary electrons in the beam separator; and
the electric field is such as to apply a force to the primary electrons that is opposite in direction to a force applied to the primary electrons by the magnetic field generated by the beam separator coil.

6. The column of claim 5, wherein the force applied by the electric field to a portion of the primary beam in the beam separator having a selected nominal energy is substantially equal in magnitude to the force applied to the same portion of the primary beam by the magnetic field.

7. The column of claim 5, wherein:
the dispersion device comprises dispersion device electrodes configured to apply an electric field to primary electrons in the dispersion device; and
the electric field is such as to apply a force to the primary electrons that is opposite in direction to a force applied to the primary electrons by the magnetic field generated by the dispersion device coil.

8. The column of claim 7, wherein the force applied by the electric field to a portion of the primary beam in the dispersion device having a selected nominal energy is substantially equal in magnitude to the force applied to the same portion of the primary beam by the magnetic field.

9. The column of claim 7, wherein the one or more common power supplies comprises a common voltage source configured to drive both the beam separator electrodes and the dispersion device electrodes.

10. The column of claim 5, wherein either or both of the beam separator and the dispersion device comprises adjustment electrodes configured to apply an electric field to primary electrons that is perpendicular or oblique to the electric field applied by the beam separator electrodes or the dispersion device electrodes.

11. The column of claim 10, further comprising at least one independent power supply configured to drive the adjustment electrodes, each independent power supply being independent of the one or more common power supplies.

12. The column of claim 1, wherein the dispersion device is configured to influence electrons along a smaller portion of the primary beam path than the beam separator.

13. The column of claim 1, wherein the beam separator and dispersion device are directly consecutive along the primary beam path.

14. A charged particle assessment tool comprising;
an electron optical column configured to direct a beam of primary electrons along a primary beam path onto a sample, the electron optical column comprising:

a beam separator configured to divert away from the primary beam path a beam of secondary electrons emitted from the sample along the primary beam path;
a dispersion device upbeam from the beam separator, the dispersion device being configured to compensate for dispersion induced in the primary beam by the beam separator; and
one or more common power supplies each configured to drive both the beam separator and the dispersion device.

15. A method of directing a beam of primary electrons along a primary beam path onto a sample, comprising:
using a beam separator to divert away from the primary beam path a beam of secondary electrons emitted from the sample along the primary beam path; and
using a dispersion device upbeam from the beam separator to compensate for dispersion induced in the primary beam by the beam separator, wherein one or more common power supplies are used to drive both the beam separator and the dispersion device.

16. The method of claim 14, wherein:
using the beam separator to divert the beam of secondary electrons uses magnetic field generated by a beam separator coil; and
using the dispersion device to compensate for dispersion uses a magnetic field generated by a dispersion device coil.

17. The method of claim 14, wherein the one or more common power supplies comprises a common current source configured to drive both the beam separator coil and the dispersion device coil.

18. The charged particle assessment tool of claim 17, wherein:
the beam separator is configured to divert the beam of secondary electrons using a magnetic field generated by a beam separator coil; and
the dispersion device is configured to compensate for the dispersion using a magnetic field generated by a dispersion device coil.

19. The charged particle assessment tool of claim 18, wherein:
the beam separator comprises beam separator electrodes configured to apply an electric field to primary electrons in the beam separator; and
the electric field is such as to apply a force to the primary electrons that is opposite in direction to a force applied to the primary electrons by the magnetic field generated by the beam separator coil.

20. The charged particle assessment tool of claim 18, wherein the one or more common power supplies comprises a common current source configured to drive both the beam separator coil and the dispersion device coil.

* * * * *